United States Patent
Tanizawa

(10) Patent No.: US 7,348,602 B2
(45) Date of Patent: Mar. 25, 2008

(54) NITRIDE SEMICONDUCTOR DEVICE

(75) Inventor: Koji Tanizawa, Tokushima (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/966,034

(22) Filed: Oct. 18, 2004

(65) Prior Publication Data

US 2005/0145860 A1    Jul. 7, 2005

Related U.S. Application Data

(62) Division of application No. 09/534,503, filed on Mar. 24, 2000, now Pat. No. 6,838,705.

(30) Foreign Application Priority Data

| Mar. 29, 1999 | (JP) | P 11-087078 |
| Apr. 1, 1999 | (JP) | P 11-095420 |
| Apr. 5, 1999 | (JP) | P 11-098158 |
| Apr. 21, 1999 | (JP) | P 11-113050 |
| Sep. 8, 1999 | (JP) | P 11-254238 |

(51) Int. Cl.
*H01L 29/225* (2006.01)

(52) U.S. Cl. ........ 257/97; 257/101; 257/E33.025; 257/E33.032; 257/E33.043; 257/E33.048

(58) Field of Classification Search ........ 257/101, 257/103, 190, 615, 97, 15, 28, 21, 11, 10, 257/85, 90, 191, 200, 86, 87, 96, E33.025, 257/E33.027, E33.032, E33.043, E33.048; 438/602, 603

See application file for complete search history.

(56) References Cited

U.S. PATENT DOCUMENTS 5,146,465 A    9/1992    Khan et al. ........ 372/45.01

(Continued)

FOREIGN PATENT DOCUMENTS

EP    1014455 A1    6/2000

(Continued)

OTHER PUBLICATIONS

Shuji Nakamura et a., "Present Status of InGaN/GaN/AlgaN-Based Laser Diodes" Jpn. J. Appl. Phys. vol. 36 (1997) pp. L1568-L1571, Part 2, No. 12A, Dec. 1, 1997.

(Continued)

*Primary Examiner*—Matthew Smith
*Assistant Examiner*—Julio J. Maldonado
(74) *Attorney, Agent, or Firm*—Volentine & Whitt, PLLC

(57) ABSTRACT

The present invention provides a nitride semiconductor light emitting device with an active layer of the multiple quantum well structure, in which the device has an improved luminous intensity and a good electrostatic withstanding voltage, thereby allowing the expanded application to various products. The active layer 7 is formed of a multiple quantum well structure containing $In_aGa_{1-a}N$ ($0 \leq a < 1$). The p-cladding layer 8 is formed on said active layer containing the p-type impurity. The p-cladding layer 8 is mode of a multi-film layer including a first nitride semiconductor film containing Al and a second nitride semiconductor film having a composition different from that of said first nitride semiconductor film. Alternatively, the p-cladding layer 8 is made of single-layered layer made of $Al_bGa_{1-b}N$ ($0 \leq b \leq 1$). A low-doped layer 9 is grown on the p-cladding layer 8 having a p-type impurity concentration lower than that of the p-cladding layer 8. A p-contact layer is grown on the low-doped layer 9 having a p-type impurity concentration higher than those of the p-cladding layer 8 and the low-doped layer 9.

9 Claims, 3 Drawing Sheets

U.S. PATENT DOCUMENTS

| | | | |
|---|---|---|---|
| 5,656,832 A | 8/1997 | Ohba et al. | |
| 5,679,965 A | 10/1997 | Schetzina | 257/103 |
| 5,932,896 A | 8/1999 | Sugiura et al. | 257/94 |
| 5,959,307 A | 9/1999 | Nakamura et al. | 257/14 |
| 6,040,588 A * | 3/2000 | Koide et al. | 257/15 |
| 6,064,079 A * | 5/2000 | Yamamoto et al. | 257/101 |
| 6,104,740 A * | 8/2000 | Floyd | 372/50.12 |
| 6,172,382 B1 | 1/2001 | Nagahama et al. | |
| 6,337,493 B1 | 1/2002 | Tanizawa et al. | |
| 7,193,246 B1 | 3/2007 | Tanizawa et al. | |
| 2003/0010993 A1 | 1/2003 | Nakamura et al. | |

FOREIGN PATENT DOCUMENTS

| | | |
|---|---|---|
| EP | 1 017 113 A1 | 7/2000 |
| JP | 07249795 A | 9/1995 |
| JP | 08051251 A | 2/1996 |
| JP | 08097468 A | 4/1996 |
| JP | 08228025 A | 9/1996 |
| JP | 08330629 A | 12/1996 |
| JP | 09232629 A | 9/1997 |
| JP | 09298341 A | 11/1997 |
| JP | 10-135514 | 5/1998 |
| JP | 06151966 A | 5/1998 |
| JP | 10135514 A | 5/1998 |
| JP | 11-177175 | 2/1999 |
| JP | 11031841 | 2/1999 |
| JP | 11068155 | 3/1999 |
| WO | WO99/05728 | 2/1999 |

OTHER PUBLICATIONS

Shuji Nakamura et al., "InGaN/GaN/AlGa-Based Laser Diodes with Modulation-Doped Strained-Layer Superlattices" Jpn. J. Appl. Phys. vol. 36 (1997) pp. L1568-L1571 part 2, No. 12A, Dec. 1, 1997.

Shunji Nakamura et al., "InxGa(1-x)N/InyGa(1-7)N supperlattices grown on GaN films" J. Appl. Phys., vol. 74, No. 6, Sep. 15, 1993, pp. 3911-3915.

* cited by examiner

NITRIDE SEMICONDUCTOR DEVICE

CROSS-REFERENCE TO RELATED APPLICATION

This is a divisional of, and a claim of priority is made to, U.S. non-provisional application Ser. No. 09/534,503, filed Mar. 24, 2000, now U.S. Pat. No. 6,838,705 incorporated herein by reference in its entirety.

BACKGROUND OF THE INVENTION

1. Technical Field of the Invention

This invention relates to a light emitting device such as a light emitting diode (LED) and a laser diode (LD), a photodetector such as a solar cell and an optical sensor, and other nitride semiconductor devices used for electrical devices, for example, a transistor and a power device (which is expressed in the formula, for instance, $In_X Al_Y Ga_{1-X-Y} N$, $0 \leq X$, $0 \leq Y$, $X+Y \leq 1$).

2. Description of Related Art

A nitride semiconductor device has been practically developed for use of a high luminous blue and pure green LED to fabricate light sources of a full color LED display, a traffic signal, and an image scanner. The LED device basically comprises a substrate of sapphire, a buffer layer made of GaN, an n-contact layer made of GaN doped with Si, an active layer made of a single quantum well (SQW) structure of InGaN or made of a multiple quantum well (MQW) structure containing InGaN, a p-cladding layer made of AlGaN doped with Mg, and a p-contact layer made of GaN doped with Mg, in which those layers are successively formed on the substrate. The LED device has an excellent opto-electronic characteristic, for example, the blue LED has a peak wavelength of 450 nm, a luminous intensity of 5 mW, and an external quantum efficiency of 9.1%, and the green LED has the peak wavelength of 520 nm, the luminous intensity of 3 mW, and the external quantum efficiency of 6.3%, at the forward current of 20 mA.

Since the multiple quantum well structure has a plurality of mini-bands, each of which emits light efficiently even with a small current, it is expected that the device characteristics is improved, for example, the LED device with the active layer of the multiple quantum well structure characteristics has the luminous intensity greater than that with of the single quantum well structure.

JP10-135514, A, for example, describes the LED device with an active layer of the multiple quantum well structure, which includes a light emitting layer with a barrier layer of undoped GaN and a well layer of undoped InGaN, and also includes cladding layers having bandgap greater than that of the barrier layer of the active layer, in order to improve the luminous efficiency and a luminous intensity.

However the luminous intensity of the conventional LED device is not enough for use as a light source of an illumination lamp and/or an outside display exposed to direct sunshine. It has been long felt needed that the light emitting device having an active layer of quantum well structure will be improved in its luminous intensity, but such a LED device with higher luminous intensity has not yet been available.

Also, the device made of nitride semiconductor has a layer structure, which may be inherently be weak against the electrostatic voltage. Thus, the device of nitride semiconductor may be easily damaged even by the electrostatic voltage of 100V which is much lower than that people can feel. There are substantial risks of damaged device characteristics in handling the device, for example, taking it out of an antistatic bag, and assembling it to a product. Therefore, the electrostatic withstanding voltage of the device has been desirably improved reducing the aforementioned risks, thereby enhancing the reliability of the nitride semiconductor device.

SUMMARY OF THE INVENTION

The first object of the present invention is to provide a first nitride semiconductor light emitting device with an active layer of the multiple quantum well structure, in which the device has an improved luminous intensity and a good electrostatic withstanding voltage, thereby allowing the expanded application to various products.

The second object of the invention is to provide a nitride semiconductor light emitting device having an improved electrostatic withstanding voltage.

The first nitride semiconductor device of the present invention as will be described below can achieve the first object.

The first nitride semiconductor device of the present invention, comprising:

a) a substrate;

b) an active layer of a multiple quantum well structure containing $In_a Ga_{1-a} N$ ($0 \leq a < 1$);

c) an n-region nitride semiconductor layer structure interposed between the substrate and the active layer;

d) a p-type multi-film layer formed on the active layer, the p-type multi-film layer including, a first nitride semiconductor film containing Al, a second nitride semiconductor film having a composition different from that of the first nitride semiconductor film, at least one of the first and second nitride semiconductor films having a p-type impurity;

e) a p-type low-doped layer formed on the p-type multi-film layer, having a concentration of the p-type impurity lower than that of the p-type multi-film layer; and f) a p-contact layer formed on the p-type low-doped layer, having a concentration of the p-type impurity higher than that of the p-type multi-film layer.

According to the first nitride semiconductor device of the present invention, the p-type low-doped layer is made of $Al_s Ga_{1-s} N$ ($0 < s < 0.5$), and the p-type low-doped layer has a composition ratio of Al less than that of the p-type multi-film layer.

According to the first nitride semiconductor device of the present invention, the p-type low-doped layer is formed of a multi-film layered structure with layers made of $Al_s Ga_{1-s} N$ ($0 < s < 0.5$), and an average composition ratio of Al of the p-type low-doped layer is less than that of the p-type multi-film layer.

According to the first nitride semiconductor device of the present invention, the impurity contained within the p-type multi-film layer and the p-contact layer is diffused into the p-type low-doped layer.

According to the first nitride semiconductor device of the present invention, the concentration of the p-type impurity of the multi-film layer falls within the range of $5 \times 10^{17}/cm^3$ through $1 \times 10^{21}/cm^3$.

According to the first nitride semiconductor device of the present invention, the concentration of the p-type impurity of the low-doped layer is less than $1 \times 10^{19}/cm^3$.

According to the first nitride semiconductor device of the present invention, wherein the concentration of the p-type impurity of the p-contact layer falls within the range of $1\times10^{18}/cm^3$ through $5\times10^{21}/cm^3$.

According to the first nitride semiconductor device of the present invention, wherein the n-region nitride semiconductor layer structure includes an n-region multi-film layer having a lower-film made of undoped nitride semiconductor, a middle-film doped with an n-type impurity, and an upper-film made of undoped nitride semiconductor.

According to the first nitride semiconductor device of the present invention, the n-region nitride semiconductor layer structure further includes an undoped GaN layer and an n-contact layer containing an n-type impurity, successively formed on the substrate.

According to the first nitride semiconductor device of the present invention, the n-type first multi-film layer is formed on the n-contact layer, and the total thickness of the undoped GaN layer, the n-contact layer, and the n-type first multi-film layer falls within the range of 2 through 20 μm.

According to another first nitride semiconductor device of the present invention, comprising:

a) a substrate;

b) an active layer of a multiple quantum well structure containing $In_aGa_{1-a}N$ ($0 \leq a < 1$);

c) an n-region nitride semiconductor layer structure interposed between the substrate and the active layer;

d) a p-type single-layered layer formed on the active layer, made of $Al_bGa_{1-b}N$ ($0 \leq b \leq 1$) containing a p-type impurity;

e) a p-type low-doped layer formed on the p-type single-layered layer, having a concentration of the p-type impurity lower than that of the p-type single-layered layer; and f) a p-contact layer formed on the p-type low-doped layer, having a concentration of the p-type impurity higher than that of the p-type single-layered layer.

According to the first nitride semiconductor device of the present invention, the p-type low-doped layer is made of $Al_sGa_{1-s}N$ ($0 < s < 0.5$), and the p-type low-doped layer has a composition ratio of Al less than that of the p-type single-layered layer.

According to the first nitride semiconductor device of the present invention, the p-type low-doped layer is made of $Al_sGa_{1-s}N$ ($0 < s < 0.5$), and an average composition ratio of Al of the p-type low-doped layer is less than that of the p-type single-layered layer.

According to the first nitride semiconductor device of the present invention, the impurity contained within the p-type single-layered layer and the p-contact layer is diffused into the p-type low-doped layer.

According to the first nitride semiconductor device of the present invention, the concentration of the p-type impurity of the single-layered layer falls within the range of $5\times10^{19}/cm^3$ through $1\times10^{21}/cm^3$.

According to the first nitride semiconductor device of the present invention, the concentration of the p-type impurity of the low-doped layer is less than $1\times10^{19}/cm^3$.

According to the first nitride semiconductor device of the present invention, the concentration of the p-type impurity of the p-contact layer falls within the range of $1\times10^{18}/cm^3$ through $5\times10^{21}/cm^3$.

According to the first nitride semiconductor device of the present invention, the n-region nitride semiconductor layer structure includes an n-region multi-film layer having a lower-film made of undoped nitride semiconductor, a middle-film doped with an n-type impurity, and an upper-film made of undoped nitride semiconductor.

According to the first nitride semiconductor device of the present invention, the n-region nitride semiconductor layer structure further includes an undoped GaN layer and an n-contact layer containing an n-type impurity, successively formed on the substrate.

According to the first nitride semiconductor device of the present invention, the n-type first multi-film layer is formed on the n-contact layer, and the total thickness of the undoped GaN layer, the n-contact layer, and the n-type first multi-film layer falls within the range of 2 through 20 μm.

Therefore, the first nitride semiconductor device according to the present invention comprises a p-type layer (p-type multi-film layer or p-type single-layered layer), a low-doped layer, and a p-contact layer, which are successively deposited on the active layer (in the p-region of the device). Each of the p-type layer, the low-doped layer, and the p-contact layer is adjusted to have the p-type impurity concentration comparatively medium-doped, low-doped, and high-doped, respectively. The resultant distribution of the p-type impurity concentration results in improving the luminous intensity and the electrostatic withstanding voltage.

Although the p-type layer, in general, functions as a cladding layer, it is not specifically limited thereto, it would fall within the scope of the present invention even in case where the p-type layer does not function as a cladding layer.

Further, the p-type low-doped layer is made of $Al_sGa_{1-s}N$ ($0 < s < 0.5$) and has the composition ratio of Al less than that of the p-type layer (the average composition ratio of Al where the p-type layer is multi-film layer), so that the low-doped layer can be thinned maintaining the luminous intensity and the electrostatic withstanding voltage favorable. Thus, the manufacturing step for the low-dope layer can be shortened.

According to the first nitride semiconductor device of the present invention, the p-type low-doped layer may be formed of the multi-film layer including layers made of $Al_sGa_{1-s}N$ ($0 < s < 0.5$), in which the average Al composition ratio of the p-type low-doped layer is set less than that of the p-type multi-film cladding layer.

The p-type low-doped layer contains the p-type impurity not only because the impurity is taken from the source of the impurity gas flow into the p-type low-doped layer during manufacturing, but also because the impurity within the p-cladding layer adjacent thereto is diffused into the p-type low-doped layer during manufacturing. Therefore, the p-type impurity concentration of the p-cladding layer can be readily adjusted by adjusting the p-type impurity concentration of the p-type low-doped layer.

As described above, the p-cladding layer (p-type multi-film layer or p-type single-layered layer), the low-doped layer, and the p-contact are adjusted to have the p-type impurity concentration comparatively medium-doped, low-doped, and high-doped, respectively, and in addition to that, preferably, they fall within the range of $5\times10^{17}/cm^3$ through $1\times10^{21}/cm^3$, less than $1\times10^{18}/cm^3$, and $1\times10^{18}/cm^3$ through $5\times10^{21}/cm^3$, respectively. Thus, the first nitride semiconductor device of the present invention is provided, of which luminous intensity and electrostatic withstanding voltage are improved.

The first nitride semiconductor device according to the present invention preferably comprises the n-region nitride semiconductor layer structure including an n-region multi-film layer having a lower-film made of undoped nitride semiconductor, a middle-film doped with an n-type impurity, and an upper-film made of undoped nitride semiconductor, thus resulting in improving the electrostatic withstanding voltage.

Further, the first nitride semiconductor device according to the present invention preferably comprises an n-contact layer and an undoped layer, which are grown on the substrate and beneath the first n-region multi film layer, thereby reducing the electrostatic withstanding voltage.

According to the first nitride semiconductor device of the present invention, in order to further reduce the electrostatic withstanding voltage, the total thickness of the undoped GaN layer, the n-contact layer, and the first n-region multi-film layer is set to fall within the range of 2 through 20 µm, preferably 3 through 10 µm, more preferably 4 through 9 µm.

It is noted that the terminology of "undoped layer" means the layer, in which the impurity is not intentionally doped. Even if the layer contains the impurity due to the diffusion from the adjacent layers, or due to the contamination from the material and the manufacturing equipment, the layer is still referred to as the undoped layer. If the layer diffused with the impurity from the adjacent layers may often have the gradient impurity distribution in the direction of the thickness.

Also, it is noted that layers having different composition mean, for example, layers which are made of different elements (such as elements of the binary and ternary compounds), layers which have different composition ratios, and layers which have different bandgaps each other. In case where the layer is formed of the multi-film layer, the composition ratios and bandgaps are averaged.

Further, various measurement methods can be adapted for measuring the impurity concentration, for example, the Secondary Ion Mass Spectrometry can be used.

The Second nitride semiconductor device of the present invention as will be described below can achieve the second object.

According to the Second nitride semiconductor device of the present invention, comprising:

a) a substrate;

b) an n-region nitride semiconductor layer structure formed on the substrate;

c) an active layer of a multiple quantum well structure formed on the n-region nitride semiconductor layer structure;

d) a first p-type layer formed on the active layer, being made of p-type nitride semiconductor;

e) a p-contact layer;

f) a p-type low-doped layer interposed between the active layer and the p-contact layer, wherein the p-type low-doped layer has the p-type impurity concentration that is minimized to less than $1 \times 10^{19}/cm^3$ and gradually increases towards the p-contact layer and the first p-type layer.

Since the Second nitride semiconductor device of the present invention includes the low-doped layer interposed between the p-contact layer and the first p-type layer, the electrostatic withstanding voltage can be improved.

According to the Second nitride semiconductor device of the present invention, the p-type low-doped layer is made of undoped nitride semiconductor, and the impurity contained within the p-contact layer and the first p-type layer is diffused into the p-type low-doped layer.

According to the Second nitride semiconductor device of the present invention, the p-type low-doped layer has the thickness adjusted so that the minimum of the p-type impurity concentration is less than $1 \times 10^{19}/cm^3$.

According to the Second nitride semiconductor device of the present invention, the active layer is made of the multiple quantum well structure including at least one layer made of $In_aGa_{1-a}N$ ($0 \leq a < 1$).

Thus, the luminous intensity as well as the electrostatic withstanding voltage can be improved resulting in the expanded application of the nitride semiconductor device with the active layer of the multiple quantum well structure for various products.

According to the Second nitride semiconductor device of the present invention, the p-type low-doped layer are formed of a multi-film layer by alternately laminating two kinds of films, which have compositions different from each other.

According to the Second nitride semiconductor device of the present invention, the first p-type layer contains Al.

According to the Second nitride semiconductor device of the present invention, the first p-type layer is formed of p-type multi-film layer by laminating a first nitride semiconductor film containing Al and a second nitride semiconductor film having a composition different from that of the first nitride semiconductor film, and at least one of the first and second nitride semiconductor film contains the p-type impurity therein.

According to the Second nitride semiconductor device of the present invention, the p-type low-doped layer is made of GaN.

According to the Second nitride semiconductor device of the present invention, the p-type low-doped layer is made of $Al_sGa_{1-s}N$ ($0<s<0.5$), and the p-type low-doped layer has a composition ratio of Al less than that of the p-type multi-film layer.

According to the Second nitride semiconductor device of the present invention, the p-type low-doped layer is formed of a multi-film layered structure with layers made of $Al_sGa_{1-s}N$ ($0<s<0.5$), and an average composition ratio of Al of the p-type low-doped layer is less than that of the p-type multi-film layer.

According to the Second nitride semiconductor device of the present invention, the p-type low-doped layer is formed by alternately laminating layers made of $Al_sGa_{1-s}N$ ($0<s<0.5$) and layers made of GaN.

According to the Second nitride semiconductor device of the present invention, the n-region nitride semiconductor layer structure includes an n-region multi-film layer having a lower-film made of undoped nitride semiconductor, a middle-film doped with an n-type impurity, and an upper-film made of undoped nitride semiconductor.

According to the Second nitride semiconductor device of the present invention, the n-region nitride semiconductor layer structure further includes an n-contact layer containing an n-type impurity, and an undoped GaN layer interposed between the substrate and the n-contact layer.

According to the Second nitride semiconductor device of the present invention, the n-type first multi-film layer is formed on the n-contact layer, and the total thickness of the undoped GaN layer, the n-contact layer, and the n-type first multi-film layer falls within the range of 2 through 20 µm.

BRIEF DESCRIPTION OF THE DRAWINGS

The present invention become more fully understood from the detailed description given hereinafter and accompanying drawings which are given by way of illustration only, and thus are not limitative of the present invention and is characterized in that, FIG. 1 is a schematic sectional view of an LED device according to an embodiment of the present invention showing its layer structure.

DETAILED DESCRIPTION OF THE PREFERRED EMBODIMENTS

Embodiment 1

Figure 1:
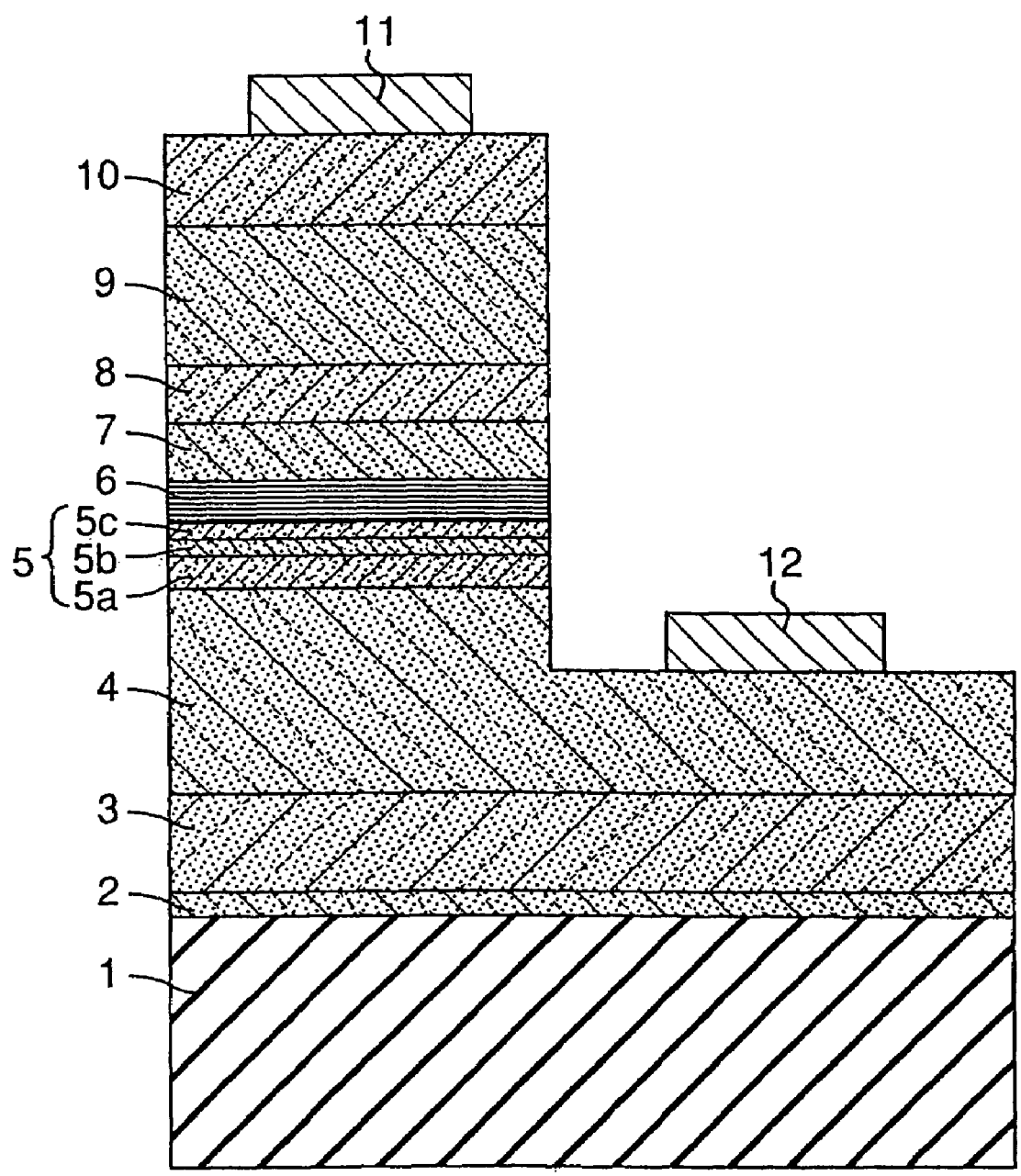

FIG. 1 is a schematic sectional view of an LED device according to an embodiment of the present invention.

The nitride semiconductor device according to Embodiment 1 of the present invention relates to the first nitride semiconductor device of the present invention, and the structure of the first nitride semiconductor device is not limited to the embodiments as described hereinafter. Rather, the present invention can be applied to any nitride semiconductor devices which comprises, at least, a medium-doped p-cladding layer (formed of a p-type multi-film layer or a p-type single-layered layer), a p-type low-doped layer doped with a low p-type impurity concentration, and a high-doped p-contact layer doped with a high p-type impurity concentration, in which those layers are successively grown on the active layer.

As shown in FIG. 1, the nitride semiconductor device of Embodiment 1 comprises a substrate 1, a buffer layer 2, undoped GaN layer 3, an n-contact layer 4 doped with n-type impurity, a first n-region multi-film layer 5 which has an undoped lower-film 5a, middle-film 5b doped with n-type impurity, and an undoped upper-film 5c, a second multi-film layer 6 having a third and a fourth nitride semiconductor film, an active layer 7 of the multiple quantum well structure, a p-cladding layer 8 made of a p-type multi-film layer or a p-type single-layered layer, a low-doped p-type layer 9 doped with a low concentration of p-type impurity, and a high doped p-contact layer 10 doped with a high concentration of p-type impurity, in which those layers are formed in this order the substrate.

The nitride semiconductor device further comprises an n-electrode 12 formed on the n-contact layer 4, and p-electrode 11 deposited on the p-contact layer 10.

Details of each layer of the nitride semiconductor device according to Embodiment 1 will be described hereinafter.

According to the present invention, the substrate 1 may be made of insulative material such as sapphire having its principal surface represented by a C-, R- or A-face or spinel ($MgAl_2O_4$), or semiconductor material of SiC (including 6H, 4H or 3C), Si, ZnO, GaAs, GaN, or the like.

Also, the buffer layer 2 may be made of the nitride semiconductor expressed in a formula of $Ga_dAl_{1-d}N$ (where $0<d\leq1$). However, since the buffer layer has better crystallinity as the composition ratio of Al is less, the buffer layer 2 preferably has small composition ratio of Al, and more preferably is made of GaN.

The buffer layer 2 may have a thickness adjusted to fall within the range of 0.002 through 0.5 μm, preferably within the range of 0.005 through 0.2 μm, and more preferably within the range of 0.01 through 0.02 μm, so that the nitride semiconductor of the buffer layer 2 has good crystalline morphology, thereby improving the crystallinity of the nitride semiconductor layers to be grown on the buffer layer 2.

The growth temperature of the buffer layer 2 is adjusted to fall within the range of 200 through 900° C. and preferably within the range of 400 through 800° C., so that the resultant buffer layer 2 exhibits an excellent polycrystallinity. The buffer layer 2, in turn, act as a seed crystal to improve the crystallinity of the nitride semiconductor layers to be grown on the buffer layer 2.

The buffer layer 2 which is grown at a relatively low temperature may not be essential and may therefore be eliminated depending on the type of material for the substrate 1 and/or the growing method employed.

Next, the undoped GaN layer 3 is formed on the buffer layer 2 by depositing GaN on the buffer layer 2 and doping no n-type impurity into the GaN layer. The undoped GaN layer 3 grown on the buffer layer 2 can be formed with a good crystallinity, which in turn, allows the n-contact layer 4 subsequently deposited on the undoped GaN layer 3 to have a good crystallinity. The undoped GaN layer 3 has a thickness not thinner than 0.01 μm, preferably not thinner than 0.5 μm, and more preferably not thinner than 1 μm. If the undoped GaN layer 3 has a thickness as specified above, the other layers to be successively grown over the undoped GaN layer 3 have good crystallinity. Although the upper limit of thickness of the undoped GaN layer 3 may not be essential for the invention and therefore not specified, it should be properly adjusted in consideration of the manufacturing efficiency. Also, the uppermost thickness of the undoped GaN layer 3 may be preferably adjusted so that the total thickness of the undoped GaN layer 3, the n-contact layer 4, and the first n-region multi-film layer 5 falls within the range of 3 through 20 μm (preferably within the range of 3 through 10 μm, more preferably within the range of 4 through 9 μm) in order to improve the characteristics of the electrostatic withstanding voltage.

According to the present invention, the n-contact layer 4 doped with n-type impurity contains the n-type impurity in the concentration of not less than $3\times10^{18}/cm^3$, and preferably not less than $5\times10^{18}/cm^3$. The use of the relatively high concentration of the n-type impurity in the n-contact layer 4 is effective to lower the Vf (forward voltage) and threshold current. On the other hand, if the concentration of the n-type impurity departs from the range specified above, the Vf will hardly lower. Since the n-contact layer 4 is formed on the undoped GaN layer 3 having low concentration of n-type impurity and a good crystallinity, the n-contact layer has a good crystallinity even though it contains the relatively high concentration of the n-type impurity. Although the present invention does not specifically require the uppermost concentration limit of the n-type impurity concentration within the n-contact layer 4, the uppermost limit is preferably not greater than $5\times10^{21}/cm^3$, which allows the contact layer 4 capable of functioning as a contact layer.

The n-contact layer 4 may be formed of material expressed as the general formula of $In_eAl_fGa_{1-e-f}N$ (where $0\leq e$, $0\leq f$, and $e+f\leq1$). However, the use of GaN or $Al_fGa_{1-f}N$ where suffix f is not greater than 0.2 is advantageous in that the nitride semiconductor layer having a minimized crystal defect can easily be obtained. The n-contact layer 4 may, although not limited thereto, have a thickness within the range of 0.1 through 20 μm, preferably within the range of 1.0 through 10 μm, so that the n-contact layer 4 on which the n-electrode 12 is formed can be formed with a low resistivity thereby to reduce the Vf.

Also, the uppermost thickness of the n-contact layer 4 can be preferably adjusted so that the total thickness of the undoped GaN layer 3, the n-contact layer 4, and the first n-region multi-film layer 5 falls within the range of 3 through 20 μm (preferably within the range of 3 through 20 μm, more preferably within the range of 4 through 9 μm), which allows the electrostatic withstanding voltage to be improved.

And the n-contact layer 4 can be omitted by forming the first n-region multi-film layer 5 relatively thick. Next, according to Embodiment 1, the first n-region multi-film layer 5 includes three films of an undoped lower-film 5a, a middle-film 5b doped with n-type impurity and an undoped upper-film 5c. It is noted that any other films may be included in the first multi-film layer 5 according to the present invention. Also, the first n-region multi-film layer 5 may contact with the active layer, alternatively, another layer may be interposed between the active layer and the first n-region multi-film layer. In case where the first n-region multi-film layer is formed in the n-region as Embodiment 1, the device characteristics such as the luminous intensity and the electrostatic withstanding voltage can be improved. Therefore, it is understood that the first n-region multi-film layer 5 substantially contributes the improved electrostatic withstanding voltage.

The nitride semiconductor including the lower-film 5a through the upper-film 5c can be formed of various composition of the nitride semiconductor expressed in a formula of $In_gAl_hGa_{1-g-h}N$ ($0 \leq g < 1$, $0 \leq h < 1$), and preferably, it is made of the composition of GaN. Also the composition of each film of the first n-region multi-film layer 5 may be same or different.

Although the thickness of the first n-region multi-film layer 5 may fall within the range of 175 through 12000 angstroms, preferably within the range of 1000 through 10000 angstroms, more preferably in the range of 2000 through 6000 angstroms.

Also, the thickness of the first n-region multi-film layer 5 is preferably adjusted with the aforementioned range, and in addition to that, the total thickness of the undoped GaN layer 3, the n-contact layer 4, and the first n-region multi-film layer 5 falls within the range of 3 through 20 μm (preferably within the range of 3 through 10 μm, more preferably within the range of 4 through 9 μm), which allows the electrostatic withstanding voltage to be improved.

The total thickness of the first n-region multi-film layer 5 may be adjusted to fall within the above-mentioned range by adjusting each thickness of the lower-film 5a, the middle-film 5b, and the upper-film 5c.

Although each thickness of the lower-film 5a, the middle-film 5b, and the upper-film 5c, which composes the first n-region multi-film layer 5, are not specifically limited thereto according to the present invention, each thickness of the films of the first n-region multi-film layer 5 has slightly different impact to the device characteristics. Therefore, in order to optimize the device characteristics, in consideration of the device characteristics most influenced by each thickness of the three films, the preferable ranges for each film thickness can be determined by fixing two films and gradually varying the thickness of the other film.

Even though each film alone of the first n-region multi-film layer 5 may not influence the electrostatic withstanding voltage, the combination of the films of the first n-region multi-film layer 5 may improve the various device characteristics as a whole. In particular, the first n-region multi-film layer 5 combined with such films can greatly improve the luminous intensity and the electrostatic withstanding voltage of the device. Such effect can be approved after the device including the first n-region multi-film layer 5 is actually produced. Showing some particular thickness of each film, the tendency of change of the device characteristics influenced by the various thickness of each film will be described hereinafter.

The thickness of the lower-film 5a falls within the range of 100 through 10000 angstroms, preferably within the range of 500 through 8000 angstroms, and more preferably within the range of 1000 through 5000 angstroms. As the lower-film 5a gradually becomes thicker, the electrostatic withstanding voltage becomes higher, while the Vf increases rapidly around at 10000 angstroms. On the other hand, as the lower-film 5a becomes thinner, the Vf decreases while the electrostatic withstanding voltage decreases so that the productivity tends to be reduced at the thickness less than 100 angstroms due to the lower electrostatic withstanding voltage. Since the lower-film 5a is provided to improve the crystallinity which are deteriorated by the contact layer 4 doped with n-type impurity, the lower-film 5a is preferably grown with a thickness of 500 through 8000 angstroms in order to efficiently improve the crystallinity of the layers to be formed subsequently on the lower-film.

The thickness of the middle-film 5b doped with n-type impurity falls within the range of 50 through 1000 angstroms, preferably within the range of 100 through 500 angstroms, and more preferably within the range of 150 through 400 angstroms. The middle-film 5b doped with n-type impurity has a carrier concentration sufficiently high to intensify the luminous intensity. The light emitting device without the middle-film 5b has luminous intensity less than that having this film. Contrary to this, where the thickness of the middle-film 5b is over than 1000 angstroms, the luminous intensity is reduced. Meanwhile, the electrostatic withstanding voltage is improved as the middle-film 5b is thicker, but it is reduced as the thickness is less than 50 angstroms in comparison with that where the thickness is over 50 angstroms.

The thickness of the undoped upper-film 5c falls within the range of 25 through 1000 angstroms, preferably within the range of 25 through 500 angstroms, and more preferably within the range of 25 through 150 angstroms. The undoped upper-film 5c among the first n-region multi-film layer is formed in contact with, or most adjacent to the active layer 6 preventing the current from leaking. Where the thickness of the upper-film 5c is less than 25 angstroms, it can not efficiently prevent the current from leaking. And where the thickness of the upper-film 5c is over 1000 angstroms, then the Vf is increased and the electrostatic withstanding voltage is reduced.

As described above, considering the device characteristics particularly influenced by either one of the lower-film 5a through the upper-film 5c, the thickness of each film, which are combined to form the first n-region multi-film layer 5, is adjusted so that every device characteristics is equally optimized, in particular, the luminous intensity and the electrostatic withstanding voltage are optimized. Also, the thickness of each of the lower-film 5a, the middle-film 5b, and the upper-film 5c is adjusted to fall within the aforementioned range, and the aforementioned three p-type layers with different p-type impurity concentration according to the present invention are appropriately combined with the first n-region multi-film layer 5 so that the luminous intensity, the product reliability, as well as the electrostatic withstanding voltage of the device products can be improved.

In other words, each thickness of the films of the first n-region multi-film layer 5 are determined so that the device characteristics is optimized in consideration of the relation between the p-type three layers of the present invention and the first n-region multi-film layer 5, the composition of the active layer varying corresponding to the wavelength, the condition required by the device specification such as dimensions and configurations depending on the LED device and the like.

Each film of the first multi-film layer 5 is made of composition, which may be expressed in the formula of $In_gAl_hGa_{1-g-h}N$ ($0 \leq g<1$, $0 \leq h<1$) and may be same or different from those of the other films. However, according to the present invention, the films of the first multi-film layer 5 have the composition ratios of In and Al are small, and preferably are made of $Al_hGa_{1-h}N$ in order to improve the crystallinity thereof and reduce the Vf, and more preferably of GaN. Where the first n-region multi-film layer 5 is made of $Al_hGa_{1-h}N$, the composition ratio of Al can be adjusted to fall within the range of $0 \leq h<1$, as mentioned above, as the composition ratio of Al is smaller, then the crystallinity can be improved and the Vf is reduced.

The middle-film 5b has the n-impurity concentration not less than $3 \times 10^{18}/cm^3$, and preferably not less than $5 \times 10^{18}/cm^3$. The upper limit of the n-impurity concentration thereof is preferably not greater than $5 \times 10^{21}/cm^3$, where the middle-film 5b has the n-impurity concentration within the range, the films can be grown with a comparatively good crystallinity, thereby reducing the Vf while maintaining the high luminous intensity.

An n-type impurity element may be selected from IVB or VIB Groups in the periodic table such as Si, Ge, Se, S, and O, preferably Si, Ge, or S is used for the n-type impurity.

In case where the active layer 7 is formed on the first n-region multi-film layer 5, the upper-film 5c of the first n-region multi-film layer 5 which is formed in contact with the active layer 7 may act as a barrier layer by forming the upper-film 5c of GaN.

In other words, the lower-film 5a and upper-film 5c among the first n-region multi-film layer 5, which actually contact with another layer may be formed as a part having another function in connection with the other layer.

Also, according to the present invention, an undoped single-layered layer may be used instead of the first n-region multi-film layer 5. Although the single-layered layer may be made of nitride semiconductor as expressed in a general formula of $In_gAl_hGa_{1-g-h}N$ ($0 \leq g<1$, $0 \leq h<1$), the composition ratios of In and Al contained in the undoped single-layered layer are small, and preferably it is made of $Al_hGa_{1-h}N$, and more preferably of GaN. Where the undoped single-layered layer 5 is made of $Al_hGa_{1-h}N$, the composition ratio of Al can be adjusted to fall within the range of $0 \leq h<1$. Preferably the composition ratio of the Al should be small, since the crystallinity can be improved and the Vf is reduced as the composition ratio of Al is smaller. In case where the undoped singled-layered layer is grown, the electrostatic withstanding voltage is not as good as that in case where the first n-region multi-film layer 5 is grown, but is better than that of the conventional devices. Other device characteristics are almost as good as those in case where the first n-region multi-film layer 5 is grown.

Although the thickness of the single-layered layer is not specifically limited, preferably falls within the range of 1000 through 3000 angstroms.

Next, according to the present invention, a second n-region multi-film layer 6 is composed of a third nitride semiconductor film and a fourth nitride semiconductor film having different composition from that of the third nitride semiconductor film. At least one of each of the third and fourth nitride semiconductor films is laminated alternatively (at least two films in total). Preferably three films and more preferably at least two films (at least four films) in total are laminated alternately.

At least one of the third and the fourth films of the second n-region multi-film layer 6 is set to have a thickness of 100 angstroms or less, preferably 70 angstroms or less, more preferably 50 angstroms or less. Further more preferably, both of the third and the fourth film of the second n-region multi-film layer 6 are set to have thickness of 100 angstroms or less, preferably 70 angstroms or less, more preferably 50 angstroms or less. The second n-region multi-film layer 6 is formed with such thin films to be of a superlattice structure so that the crystallinity of the second n-region multi-film layer 6 is enhanced thereby improving the luminous intensity.

At least one of the third and fourth films has thickness of 100 angstroms or less, which is thinner than the critical elastic thickness so that the crystallinity is improved. Where the crystallinity of such thin film is improved, then the another film formed on the thin film can be also formed with the improved crystallinity, so that the second n-region multi-film layer as a whole has a good crystallinity thereby improving the luminous intensity.

Also, both of the third and fourth films have thickness of 100 angstroms or less, which are thinner than the critical elastic thickness so that the crystallinity of the nitride semiconductor films are more improved in comparison with the case where it is formed of a single-layered layer or where either one of the third and fourth film has the critical elastic thickness. Where the thickness of both of the third and fourth nitride semiconductor films are 70 angstroms or less, the second n-region multi-film layer 6 is formed of superlattice structure, so that much more improved crystallinity can be achieved. The active layer 7 formed on the second n-region multi-film layer 6 can be formed with a greatly improved crystallinity as the second n-region multi-film layer 6 acts as a buffer layer.

As described above, the three layers having different p-type impurity concentration according to the present invention are combined with the first and second n-region multi-film layer so that the light emitting device can be obtained with very high luminous intensity and low Vf. The reason is not clearly explained but presumably, the crystallinity of the active layer formed on the second n-region multi-film layer is improved.

Adjacent two of the third nitride semiconductor films sandwiching the fourth nitride semiconductor film among the second n-region multi-film layer 6 have thickness that are same or different each other.

Adjacent two of the fourth nitride semiconductor films sandwiching the third nitride semiconductor film among the second n-region multi-film layer 6 have thickness that are same or different each other.

In particular, where the third and fourth nitride semiconductor film are made of the InGaN and GaN, respectively, the thickness of each of the third nitride semiconductor films of InGaN can be thicker or thinner as the third nitride semiconductor film is closer to the active layer, so that the refractive index of the second n-region multi-film layer can be substantially and gradually varied. Therefore, the resultant nitride semiconductor layer achieves the same effect as it has the substantially gradient composition. In such formed device that requires beam waveguides like a laser device, the beam waveguides are formed with the multi-film layer so that the mode of the laser beam can be adjusted.

Also, adjacent two of the third nitride semiconductor films sandwiching the fourth nitride semiconductor film of the second n-region multi-film layer 6 have a composition that are same or different each other.

In addition, adjacent two of the fourth nitride semiconductor films sandwiching the third nitride semiconductor film of the second n-region multi-film layer 6 have a composition ratio of the III group element that are same or different each other.

In particular, where the third and fourth nitride semiconductor film are made of the InGaN and GaN, respectively, the In composition ratio of each of the third nitride semiconductor films of InGaN may be gradually increased or decreased as the third nitride semiconductor film is closer to the active layer, so that such formed second n-region multi-film layer of nitride semiconductor has substantially gradient composition and the refractive index thereof can be varied. It is noted that as the In composition ratio is decreased, the refractive index is reduced.

The second n-region multi-film layer 6 may be formed spaced away from the active layer, preferably in contact with the active layer. The second n-region multi-film layer 6 formed in contact with the active layer contributes more luminous intensity.

Where the second n-region multi-film layer 6 is formed in contact with the active layer, the first film thereof contacting with the firstly laminated layer (well layer or barrier layer) of the active layer may be the third nitride semiconductor film or the fourth nitride semiconductor film, and the laminating order of the third and fourth nitride semiconductor films are not specifically limited thereto. Although FIG. 1 shows the second n-region multi-film layer 6 formed in contact with the active layer 7, another n-type nitride semiconductor layer may be interposed between the active layer 7 and the second n-region multi-film layer 6.

The third nitride semiconductor film is made of a nitride semiconductor containing In, or preferably a ternary compound of $In_kGa_{1-k}N$ (0<k<1), is characterized in that suffix k is preferably not greater than 0.5 and more preferably not greater than 0.2. On the other hand, the fourth nitride semiconductor film may be made of any suitable nitride semiconductor, which is different from that of the third nitride semiconductor film. Although not specifically limited thereto, the fourth nitride semiconductor film may be made of binary or ternary compound expressed ion the formula of $In_mGa_{1-m}N$ (0≦m<1, and m<k), which has bandgap higher than that of the third nitride semiconductor film to have an excellent crystallinity. Preferably, the fourth nitride semiconductor film may be made of GaN to have a good crystallinity. Therefore, the third and fourth nitride semiconductor films are preferably made of $In_kGa_{1-k}N$ (0<k<1) and $In_mGa_{1-m}N$ (0≦m<1, and m<k) (GaN is more preferable), respectively. More preferably, the third and fourth nitride semiconductor films are made of $In_kGa_{1-k}N$ (k≦0.5) and GaN, respectively.

Both of, either one of, or none of the third and fourth nitride semiconductor films may be doped with n-type impurity. In order to improve the crystallinity thereof, the films may be preferably modulation-doped, and more preferably, both of them are undoped. It is noted that where both of the third and fourth nitride semiconductor films are doped, the impurity concentration thereof may be different from each other.

Also it is noted that the layer, in which either one of the third and fourth nitride semiconductor film is doped with n-type impurity, is referred to as a modulation-doped layer, such modulation-doped layer contributes the higher luminous intensity.

An element selected from IV or VI Group in the periodic table such as Si, Ge, Sn, and S is used as the n-type impurity, preferably Si or Sn is used for the n-type impurity. The impurity concentration is adjusted to be not greater than $5\times10^{21}/cm^3$ and preferably not greater than $1\times10^{20}/cm^3$. If the impurity concentration is greater than $5\times10^{22}/cm^3$, the crystallinity of the nitride semiconductor films will be deteriorated, thereby reducing the luminous intensity. This is also applied for the case where the layer is modulation-doped.

According to the present invention, the active layer 7 of the multiple quantum well structure is formed of nitride semiconductor containing In and Ga, preferably $In_aGa_{1-a}N$ (where 0≦a<1). Further, although the active layer 7 may be doped with n-type or p-type impurity, preferably is undoped (with no impurity added), so that a strong band-to-band light emission can be obtained with the half width of the emission wavelength narrowed. The active layer 7 may be doped with either n-type impurity or p-type impurity or even with both impurity. Where the active layer 7 is doped with n-type impurity, the band-to-band light emission strength can further be increased as compared with the undoped active layer 7. On the other hand, the active layer 7 is doped with p-type impurity, so that the peak wavelength is shifted towards that having energy level less by 0.5 eV and the spectrum has the half width widened. The active layer doped with both of n-type and p-type impurity has the luminous intensity greater than that emitted by the active layer doped only with the p-type impurity. In particular, where the active layer doped with a p-type dopant is formed, the active layer preferably has an n-type conductivity as a whole by doping an n-type dopant such as Si therein. In order to grow the active layer with a good crystallinity, the active layer is preferably doped with no impurity, that is, non-doped.

Also, according to Embodiment 1, the device having the active layer formed of single quantum well structure has the electrostatic withstanding voltage as good as that of the multiple quantum well structure, although the former has luminous intensity less than that of the later.

The sequence of lamination of barrier and well layers forming the active layer 7 may start with the well layer and terminate with the well layer, or start with the well layer and terminate with the barrier layer. Alternatively, the sequence may start with the barrier layer and terminate with the barrier layer or start with the barrier layer and terminate with the well layer. The well layer has thickness adjusted to be not greater than 100 angstroms, preferably not greater than 70 angstroms and more preferably not greater than 50 angstroms. Although not specifically limited, the lowermost limit of thickness of the well layer may correspond to thickness of a single atom layer and, preferably not smaller than 10 angstroms. If the well layer is greater than 100 angstroms, the luminous intensity will be difficult to increase.

On the other hand, the barrier layer has thickness adjusted to be not greater than 2,000 angstroms, preferably not greater than 500 angstroms and more preferably not greater than 300 angstroms. Although not specifically limited, the lowermost limit of thickness of the barrier layer may correspond to the film thickness of a single atom layer and, preferably not smaller than 10 angstroms. If the thickness of the barrier layer falls within the above-specified range, the luminous intensity can be increased advantageously. In addition, the thickness of the active layer 7 in total is not specifically limited to a particular value, but the active layer 7 may have a total film thickness by adjusting the number of the barrier and well layers laminated and/or the sequence of lamination thereof in consideration of the desired wavelength of the eventually resulting LED device.

According to the present invention, the p-cladding layer 8 is formed as a multi-film layer or a single-layered layer with p-type impurity such that the concentration thereof may contain a medium concentration (medium-doped) between those of the p-type low-doped layer 9 and the high-doped p-contact layer 10.

Where the p-cladding layer 8 made of he multi-film layer (superlattice structure) will be described hereinafter. A p-cladding layer made of a multi-film layer is referred hereinafter as a multi-film p-cladding layer.

Films composing the multi-film p-cladding layer are a first nitride semiconductor film containing Al and a second nitride semiconductor film with different composition from that of the first nitride semiconductor film. At least ones of first and second nitride semiconductor films include the p-type impurity. The case where the first and second nitride semiconductor film has different composition each other will be rephrased hereinafter as that they have different bandgap each other.

According to the present invention, the multi-film p-cladding layer 8 may be formed by alternately laminating the first nitride semiconductor film and the second nitride semiconductor film with bandgap greater than that of the first nitride semiconductor film. At least one of the first and second nitride semiconductor films contains p-type impurity, and the p-type impurity concentration may be same or different.

The first and second nitride semiconductor films have thickness adjusted to be 100 angstroms or less, preferably 70 angstroms or less, and more preferably in the range of 10 through 40 angstroms. And the thickness of both films may be same or different. Each film has the thickness within the above-mentioned range so that each thickness is thinner than the critical elastic thickness, thereby having a good crystallinity in comparison with the thick layer of the nitride semiconductor layer. Thus, a p-layer doped with p-type impurity having the higher carrier concentration and the reduced resistance can be grown, so that the Vf and threshold value can be reduced. The multi-film layer is grown by laminating a plurality of the two types (as a pair) of films having thickness specified above of films. Either ones of the first and second nitride semiconductor films are deposited more by one time than the others. In particular, the first nitride semiconductor film is firstly and also lastly laminated. And the total thickness of the multi-film p-cladding layer 8 may be set by adjusting the thickness and laminating numbers of the first and second nitride semiconductor films. Although the total thickness of the multi-film p-cladding layer 8 is, not specifically limited thereto, 2000 angstroms or less, preferably 1000 angstroms or less, and more preferably 500 angstroms or less. The total thickness of the layer falls within the above-mentioned range, so that its luminous intensity can be increased and the Vf can be decreased.

The first nitride semiconductor film is formed of nitride semiconductor containing at least Al preferably expressed in the formula of $Al_nGa_{1-n}N$ (where $0<n\leq 1$). Meanwhile, the second nitride semiconductor film is formed of binary or ternary compound nitride semiconductor such as $Al_pGa_{1-p}N$ (where $0\leq p<1$ and $n>p$) or $In_rGa_{1-r}N$ (where $0\leq r\leq 1$). Where the p-cladding layer 8 is grown of the multi-film layer laminating alternately the first and second nitride semiconductor film, the Al composition ratio of the p-type multi-film layer will be referred to as an average ratio across the layer. Also, where the p-type low-doped layer 9 as described hereinafter is formed of $Al_sGa_{1-s}N$ (where $0<s<0.5$) or is grown with multi-film structure including films of $Al_sGa_{1-s}N$ (where $0<s<0.5$), the Al composition ratio of the multi-film p-cladding layer is preferably adjusted to be greater than that of the p-type low-doped layer 9, so that the luminous intensity and the electrostatic withstanding voltage can be advantageously improved.

Further the p-cladding layer 8 is formed of the superlattice structure so that the device has the improved crystallinity, the reduced resistance, and the reduced Vf.

The p-type impurity concentration of the medium-doped p-cladding layer 8 will be described hereinafter.

The p-type impurity concentration of the first and second nitride semiconductor film may be same or different each other.

Firstly, the case where the p-type impurity concentration of the first and second nitride semiconductor film is different each other will be described hereinafter.

Where the p-type impurity concentration of the first and second nitride semiconductor film is different each other, for example, the p-type impurity concentration of the first nitride semiconductor film with bandgap greater than that of the second nitride semiconductor film may be adjusted greater than that of the second nitride semiconductor film.

Alternately, the p-type impurity concentration of the first nitride semiconductor film with bandgap greater than that of the second nitride semiconductor film may be adjusted less than that of the second nitride semiconductor film.

As described above, the formation of the first and second nitride semiconductor film having different the p-type impurity concentration can reduce the threshold voltage, the Vf, or the like.

This is because the formation of the first nitride semiconductor film with high impurity concentration that leads high carrier density and second nitride semiconductor film with low impurity concentration that leads high carrier mobility in the multi-film p-cladding layer 8 may cause a great number of carrier from the film with high carrier density move in the film with high carrier mobility, so that the resistance of the multi-film layer can be reduced. Thus, the device has the threshold voltage the Vf reduced as mentioned above.

It is noted that where the first and second nitride semiconductor films are formed with p-type impurity concentration different from each other, the film having lower p-type impurity concentration is preferably undoped, so that the threshold voltage, the Vf (the forward voltage), or the like can be further reduced.

Where the first and second nitride semiconductor films have p-type impurity concentration different from each other, the p-type impurity concentration of the first nitride semiconductor film is adjusted such that the average p-impurity concentration of the multi-film layer is greater than that of the low-doped layer 9 and less than that of the p-contact layer 10. In particular, the p-type impurity concentration of the first nitride semiconductor film is adjusted to fall within the range of $5\times10^{17}/cm^3$ through $1\times10^{21}/cm^3$, preferably $5\times10^{18}/cm^3$ through $5\times10^{20}/cm^3$.

Where the p-type impurity concentration of the first nitride semiconductor film is greater than $5\times10^{17}/cm^3$, the injection efficiency into the active layer 7 is improved resulting in the higher luminous intensity and the lower Vf. Also, where the p-type impurity concentration of the first nitride semiconductor film is less than $1\times10^{21}/cm^3$, the crystallinity shows the tendency to be good.

Where the first and second nitride semiconductor films have p-type impurity concentration different from each other, the p-type impurity concentration of the second nitride semiconductor film is adjusted such that the average p-impurity concentration of the multi-film layer is greater than that of the low-doped layer 9 and less than that of the p-contact layer 10. In particular, although not specifically thereto, the second nitride semiconductor film has the p-type impurity concentration which is less than one-tenth of the p-type impurity concentration of the first nitride semiconductor film, or preferably is undoped. Nevertheless, the second nitride semiconductor film has the thickness that is so thin that some of the p-type impurity within the first nitride semiconductor film is diffused into the second nitride semiconductor film. In consideration of the mobility of the second nitride semiconductor film is preferably not greater than $1\times10^{20}/cm^3$.

Also, this is also applied for the case where the p-type impurity concentration of the first nitride semiconductor film with bandgap greater than that of the second nitride semiconductor film may be adjusted less than that of the second nitride semiconductor film.

Next, in case where both of the first and second nitride semiconductor films have the same p-type impurity concentration, the p-type impurity concentration will be described hereinafter.

In this case, the p-type impurity concentration of the first and second nitride semiconductor films may be adjusted to be more than that of the p-type low-doped layer 9 and less than that of the p-contact layer 10. In particular, the range of the p-type impurity concentration of the first and second nitride semiconductor films is similar to that of the first nitride semiconductor film in case where the first and second nitride semiconductor films have different p-type impurity concentration. Where the first and second nitride semiconductor films have the same p-type impurity concentration, then the p-cladding layer 8 has the crystallinity less than that in case where they have different p-type impurity concentration. However, the p-cladding layer 8 can be easily grown with high carrier density to have the increased luminous intensity, advantageously.

The p-type impurity doped into the aforementioned p-cladding layer is selected from elements of the IIA or IIB Group, such as Mg, Zn Ca, and Be, preferably is Mg, Ca, or the like.

In case where the aforementioned medium-doped multi-film p-cladding layer 8 is formed by alternately laminating a plurality of the first and second nitride semiconductor films that have different p-type impurity concentration, ones of the higher doped nitride semiconductor films are laminated with p-type impurity concentration, which are gradually less (preferably undoped) towards end portions of the p-cladding layer 8 along the thickness direction thereof, and are higher around the middle of the p-cladding layer 8. Thus, the resistibility thereof can be advantageously reduced.

Next, the case where the single-layered p-cladding layer is made of $Al_bGa_{1-b}N$ ($0\leq b\leq 1$) containing the p-type impurity will be described hereinafter. The p-cladding layer 8 formed of a single layer is referred to as a single-layered p-cladding layer.

According to the present invention, the single-layered p-cladding layer 8 is formed of nitride semiconductor of $Al_bGa_{1-b}N$ ($0\leq b\leq 1$) as described. And in case where the p-type low-doped layer 9 as will be discussed later is formed of $Al_sGa_{1-s}N$ ($0<s<0.5$), the Al composition ratio of the single-layered p-cladding layer 8 is adjusted greater than that of the p-type low-doped layer 9, so that the higher luminous intensity as well as greater electrostatic withstanding voltage can be advantageously achieved. Also, the single-layered p-cladding layer 8 containing no Al has the luminous intensity less than that containing Al, but has the electrostatic withstanding voltage as high as that containing Al.

Although not specifically limited thereto, in order to improve the luminous intensity and to reduce the Vf, the thickness of the single-layered p-cladding layer 8 is 2000 angstroms or less, preferably 1000 angstroms or less, more preferably in the range of 500 through 100 angstroms.

The p-type impurity concentration of the single-layered p-cladding layer 8 is adjusted to fall within the range of $5\times10^{17}/cm^3$ through $1\times10^{21}/cm^3$, preferably in the range of $5\times10^{18}/cm^3$ through $5\times10^{20}/cm^3$, so that the single-layered with an improved crystallinity, thereby increasing the luminous intensity, advantageously.

Although the single-layered p-cladding layer 8 has crystallinity less than but almost as good as the multi-film p-cladding layer, the manufacturing steps of the p-cladding layer 8 can be simplified because of the single-layered layer.

Next, according to the present invention, the p-type low-doped layer 9 that is doped with low impurity concentration can be formed of various nitride semiconductor expressed in the general formula of $In_rAl_sGa_{1-r-s}N$ ($0\leq r<1$, $0\leq s<1$, $r+s<1$), preferably formed of the ternary compound nitride semiconductor such as $In_rGa_{1-r}N$ ($0\leq r<1$) or $Al_sGa_{1-s}N$ ($0\leq s<1$), more preferably formed of the binary nitride compound semiconductor of GaN because of the crystallinity. Thus, the p-type low-doped layer 9 is formed of GaN to have the crystallinity improved and the electrostatic withstanding voltage increased. Where the p-type low-doped layer 9 is made of the ternary nitride compound semiconductor as expressed in the formula of $Al_sGa_{1-s}N$ ($0\leq s<1$), the Al composition ratio (or an average Al composition ratio where the layer 9 is made of multi-film layer) of the ternary nitride compound semiconductor is adjusted to be less than the average Al composition ratio of the aforementioned multi-film p-cladding layer 8 or the single-layered p-cladding layer 8, so that the low-doped layer 9 of ternary nitride compound semiconductor causes the forward voltage (Vf) suppressed, and also the luminous intensity and electrostatic withstanding voltage improved as good as the that made of GaN.

Also, in case where the p-type low-doped layer 9 is made of nitride semiconductor of $Al_sGa_{1-s}N$ ($0<s<0.5$), and the Al composition ratio of the p-type low-doped layer 9 is less than that of the p-cladding layer 8, the p-type low-doped layer 9 can be formed with high luminous intensity and the electrostatic withstanding voltage even when the p-type low-doped layer 9 is thinner than that in case where being made of GaN. Therefore, the growth time can be shortened in comparison with the GaN p-cladding layer 8.

According to Embodiment 1 of the invention, the p-type low-doped layer 9 can be formed as a multi-film layer by alternately laminating a plurality of two types of nitride semiconductor films. The similar characteristics to that of the single-layered layer can be obtained.

Where the p-type low-doped layer 9 can be formed of a multi-film layer, preferably, ones of nitride semiconductor films are made of $Al_sGa_{1-s}N$ ($0<s<0.5$), and another ones of nitride semiconductor films are made of GaN, so that the average of Al composition ratio of the p-type low-doped layer 9 is adjusted less than that of the p-cladding layer 8.

In case where the p-type low-doped layer 9 is composed of the multi-film layer having nitride semiconductor films made of $Al_sGa_{1-s}N$ ($0<s<0.5$) or having nitride semiconductor films made of $Al_sGa_{1-s}N$ ($0<s<0.5$) and nitride semiconductor films made of GaN, then the crystallinity of the p-type low-doped layer 9 can be improved and the electrostatic withstanding voltage can be increased.

Also, where the p-type low-doped layer 9 is formed of a multi-film layer, in order to improve the crystallinity thereof, each film has the thickness preferably in the range of several angstroms through 100 angstroms.

According to the present invention, the p-type low-doped layer 9 has a thickness within the range of 100 through 10000 angstroms, preferably 500 through 8000 angstroms, and more preferably 1000 through 4000 angstroms, in order to improve the luminous intensity and the electrostatic withstanding voltage.

Also, in case where the p-type low-doped layer 9 is made of nitride semiconductor of $Al_sGa_{1-s}N$ (0<s<0.5), and the Al composition ratio of the p-type low-doped layer 9 is less than that of the p-cladding layer 8, or in case where the p-type low-doped layer 9 is made of nitride semiconductor films of $Al_sGa_{1-s}N$ (0<s<0.5), and the Al composition ratio of the p-type low-doped layer 9 is less than that of the p-cladding layer 8, the thickness of the low-doped layer 9 has a thickness within the range of 100 through 10000 angstroms, preferably 300 through 5000 angstroms, and more preferably 300 through 3000 angstroms. Also, in case where the p-type low-doped layer 9 is made of nitride semiconductor of $Al_sGa_{1-s}N$ (0<s<0.5), and the Al composition ratio of the p-type low-doped layer 9 is less than that of the p-cladding layer 8, the p-type low-doped layer 9 can be formed with a good characteristics even when the p-type low-doped layer 9 is thinner than that in other cases.

According to the present invention, as described above, the p-type impurity concentration of the low-doped layer 9 is adjusted to be less than that of the p-cladding layer 8 and the p-contact layer 10.

Like this, the p-type low-doped layer 9 having the p-type impurity concentration less than that of the p-contact layer 10 and greater than that of the p-cladding layer 8 are grown between the p-contact layer 10 and the p-cladding layer 8, so that the luminous intensity as well as the electrostatic withstanding voltage can be improved.

Figure 2:
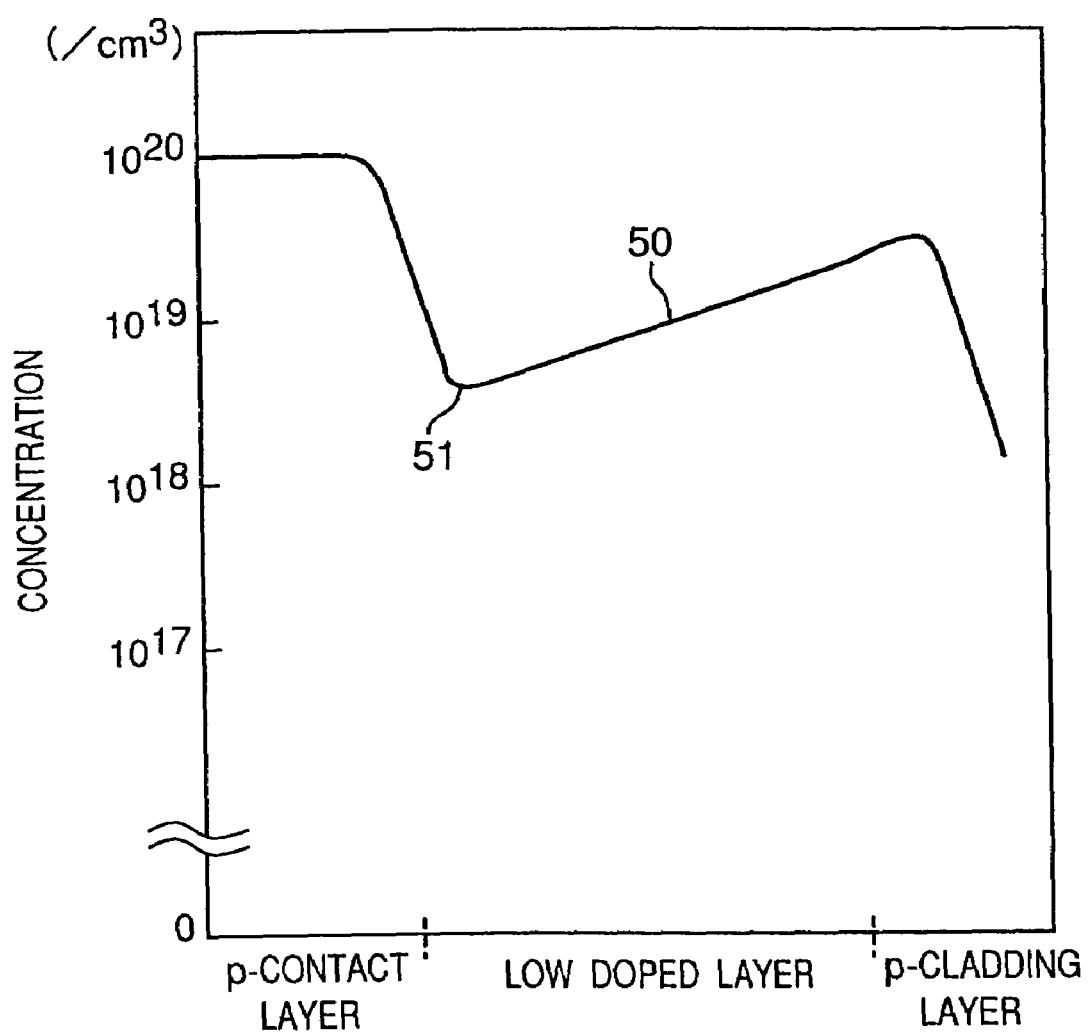
FIG. 2 is a schematic graph of a distribution of a p-type impurity concentration within a low-doped layer of the present invention, a medium-doped p-cladding layer, and a high doped p-contact layer.
Figure 3:
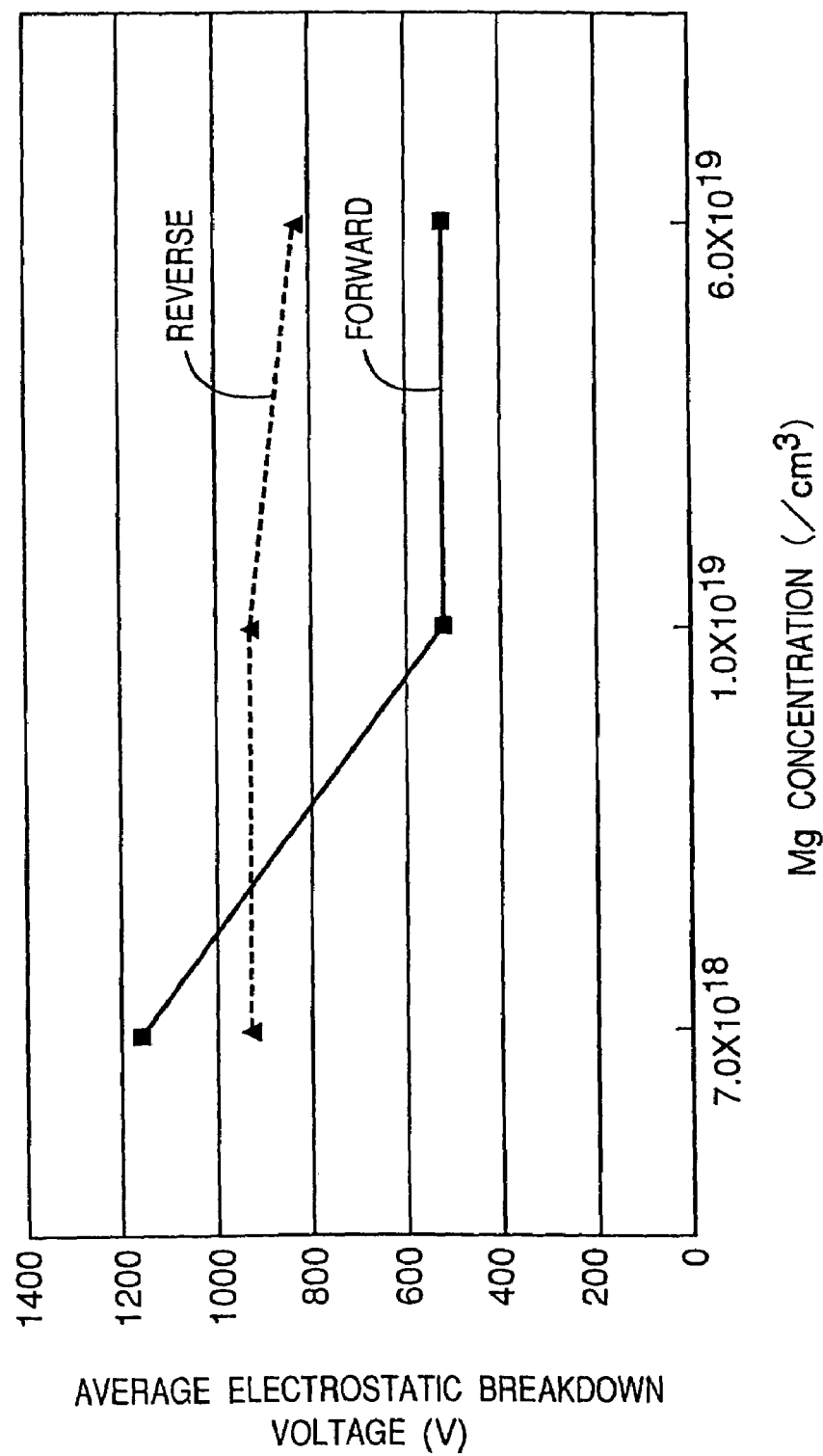
FIG. 3 is a graph of an average electrostatic withstanding voltage against the impurity concentration of the low-doped layer (average voltage for 100 samples).

Although the p-type impurity concentration of the low-doped layer 9 is not specifically limited thereto if it is less than that of the p-cladding layer 8 and the p-contact layer 10, the p-type impurity concentration of the low-doped layer 9 falls within the range of $1\times10^{19}/cm^3$ or less, preferably $5\times10^{18}/cm^3$ or less in order to improve the electrostatic withstanding voltage, as shown in FIG. 3. The low-doped layer 9 has no particular lowermost limit of the p-type impurity concentration, and may be undoped. The p-type impurity concentration of the low-doped layer 9 depends upon the doping dose while the layer 9 is grown. Further, the p-type impurity concentration of the low-doped layer 9 depends on the p-type impurity concentration of the p-cladding layer 8 and the thickness of the low-doped layer 9. Therefore, even where the low-doped layer 9 is grown and doped with the p-type impurity concentration, the p-type impurity is diffused into the low-doped layer 9 also from the p-cladding layer. Thus, the distribution of the p-type impurity concentration of the low-doped layer 9 has a similar one as shown in FIG. 2 of Embodiment 2. The distribution has a bottom region, in which the lowest p-type impurity concentration is preferably, for instance, $5\times10^{17}/cm^3$ or more.

Next, according to the present invention, the p-contact layer 10 as well as the aforementioned low-doped layer 9 can be formed of various nitride semiconductor expressed in the general formula of $In_rAl_sGa_{1-r-s}N$ (0≦r<1, 0≦s<1, r+s<1). And in order to obtain layers with good crystallinity, the p-contact layer 10 is preferably formed of the ternary nitride compound semiconductor, more preferably formed of the binary nitride compound semiconductor of GaN not including In or Al, so that the p-electrode can be grown with a better ohmic contact thereby increasing the luminous intensity.

In order to reduce the Vf and increase the electrostatic withstanding voltage, the thickness of the p-contact layer 10 may fall within the range of 0.001 through 0.5 μm, preferably within the range of 0.01 through 0.3 μm, more preferably within the range of 0.05 through 0.2 μm.

Although various elements of the p-type impurity to be doped into the high-doped p-contact layer 10, which are similar to ones doped into the p-cladding layer 8, can be used, the p-contact layer is preferably doped with Mg. Where Mg is doped into the p-contact layer 10, the p-type characteristics and the ohmic contact can be easily achieved. The p-type impurity concentration of the contact layer 10 is not specifically limited thereto if it is adjusted to be greater than those of the p-cladding layer 8 and the low-doped layer 9. However, according to the present invention, in order to suppress the Vf, the p-type impurity concentration of the p-contact layer 10 falls within the range of $1\times10^{18}/cm^3$ through $5\times10^{21}/cm^3$, preferably within the range of $5\times10^{19}/cm^3$ through $3\times10^{20}/cm^3$, and more preferably of approximately $1\times10^{20}/cm^3$.

Furthermore, the n-electrode 12 and the p-electrode 11 are deposited on the n-contact layer 4 and the p-contact layer 9 that is doped with the p-type impurity, respectively. Although not specifically limited thereto, the material of the n-electrode 12 and the p-electrode 11 can be used with, for example, W/Al and Ni/Au, respectively.

Embodiment 2

Embodiment 2 according to the present invention will be described hereinafter.

The nitride semiconductor device of Embodiment 2 relates to the Second nitride semiconductor device according to the present invention.

The nitride semiconductor device of Embodiment 2 is grown as the way similar to that of Embodiment 1 except that the p-type low-doped layer 9 is undoped such that the p-type low-doped layer 9 has the p-type impurity concentration adjusted to be lower than those of the p-cladding layer 8 and the p-contact layer 10, and also has the bottom region with a p-type impurity minimal concentration of $1\times10^{19}/cm^3$ or less.

It is noted that the p-cladding layer of Embodiment 2 corresponds to the first p-layer according to Second nitride semiconductor device.

Thus, according to Embodiment 2, the p-type low-doped layer 9 is undoped, such that the impurity is doped from the p-cladding layer 8 and p-contact layer 10 into the p-type low-doped layer 9, of which p-type impurity concentration is adjusted to be less than those of the p-cladding layer 8 and the p-contact layer 10, and of which the p-type impurity minimal concentration is adjusted to be less than $1\times10^{19}/cm^3$.

The p-type impurity minimal concentration is referred to as, for instance as shown in FIG. 2, a point 51 having a minimal impurity concentration in the distribution of the p-type impurity concentration, which is adjusted mainly by the thickness of the p-type low-doped layer 9, as will be discussed later. FIG. 2 shows the distribution of the p-type impurity concentration across the p-cladding layer 8, the p-type low-doped layer 9, and the p-contact layer 10 versus the thickness from the surface of the contact layer 10, which is schematically drawn based upon the experimental values.

As described above, where the distribution of the p-type impurity concentration of the p-type low-doped layer 9 (which is referred to as a p-type impurity concentration distribution) depends upon the diffusion of the impurity from adjacent layers, the p-type impurity concentration of the p-type low-doped layer 9 is less as remote along the thickness from the p-cladding layer 8 and the p-contact layer 10. And on the curve of the p-type impurity concentration distribution 50, there is a minimal point 51 (p-type impurity minimal concentration) of the impurity concentration between the composition faces of the p-cladding layer 8 and the p-contact layer 10.

In the distribution curve 50 shown in FIG. 2, the slope from the composition face between the low-doped layer 9 and the p-contact layer 10 to the concentration minimal point 51 is more abrupt than that from the composition face between the low-doped layer 9 and the p-cladding layer 8 to the concentration minimal point 51.

Therefore, the concentration minimal point is formed adjacent to the p-contact layer 10 rather the p-cladding layer 8 in the distribution curve 50.

The reason why there is a difference in the slopes in the distribution curve as described above, is understood because the slope adjacent to the p-cladding layer 8 is caused by the diffusion during the growth of the low-doped layer 9, contrary to this, the slope adjacent to the p-contact layer 10 is caused by the diffusion after the growth of the low-doped layer 9.

As described above, where the p-type impurity concentration of the low-doped layer 9 depends upon the diffused impurity from adjacent layers, and the p-type impurity concentration thereof is much influenced by various conditions such as the impurity concentration of adjacent layers, the growth temperature, the layer thickness, and the growth rate of adjacent layers and the low-doped layer itself. Therefore, the growth conditions as above should be adjusted appropriately for the p-type impurity concentration of the low-doped layer 9.

Since the p-type impurity concentration of the p-cladding layer 8 and the p-contact 10 layer are determined to achieve the desired characteristics of the device, according to Embodiment 2 of the invention, the p-type impurity concentration of the low-doped layer 9 should be adjusted mainly by the thickness of the p-type low-doped layer 9. For instance, the concentration minimal point 51 of the low-doped layer 9 is lower as the p-type impurity low-doped layer 9 is thicker even where the p-type impurity concentration of the p-cladding layer is unchanged.

In other words, according to the nitride semiconductor device of Embodiment 2, the thickness of the p-type low-doped layer 9 is adjusted such that the p-type low-doped layer 9 has the p-type impurity concentration minimal point controlled to be less than $1 \times 10^{19}/cm^3$ in consideration of the p-type impurity concentration of the p-cladding layer 8 and the p-contact layer 10.

Also, the p-type low-doped layer 9 has the thickness adjusted thick enough to have the p-type impurity concentration minimal point suppressed, but preferably thin enough to have it exceeding $5 \times 10^{17}/cm^3$.

As the p-type low-doped layer 9 is thicker, then the p-type impurity concentration distribution has the bottom region of the impurity concentration less than $1 \times 10^{19}/cm^3$ widened, it is needless to mention that such the wider bottom region affects advantageously according to the present invention.

In the nitride semiconductor device according to Embodiment 2, since the p-type low-doped layer 9 is formed as an undoped layer, the distribution of the p-type impurity among three layers of the p-cladding layer 8, the p-type low-doped layer 9, and the p-contact layer 10 can be readily adjusted as those of a medium doped layer, a low-doped layer, and a high doped layer, respectively. Thus, the device as well as Embodiment 1 can be improved in the luminous intensity and an electrostatic withstanding voltage.

The reason because the electrostatic withstanding voltage can be improved according to the device of Embodiment 2 is similar to that of Embodiment 1, that is, the p-type low-doped layer 9 acts as a high resistivity layer.

The p-type low-doped layer 9 of Embodiment 2, as well as of Embodiment 1, can be formed of any nitride semiconductor expressed in the general formula of $In_rAl_sGa_{1-r-s}N$ ($0 \leq r < 1$, $0 \leq s < 1$, $r+s < 1$), preferably formed of the ternary compound nitride semiconductor such as $In_rGa_{1-r}N$ ($0 \leq r < 1$) or $Al_sGa_{1-s}N$ ($0 \leq s < 1$), more preferably formed of the binary nitride compound semiconductor of GaN. If the p-type low-doped layer 9 is formed of GaN, then its crystallinity can be improved and its electrostatic withstanding voltage can be increased. Where the ternary compound nitride semiconductor expressed in the formula of $Al_sGa_{1-s}N$ ($0 \leq s < 1$) is used for the p-type low-doped layer 9, preferably its Al composition ratio is less than the average Al composition ratio of the p-type multi-film layer or the p-type single-layered layer (the Al composition ratio of the p-cladding layer 8). Thus, the forward voltage (Vf) can be suppressed, and further the luminous intensity and the electrostatic withstanding voltage can be improved as good as the case where the p-type low-doped layer 9 is made of GaN.

It is noted that the p-type low-doped layer 9 can be formed of a multi-film layer by laminating two kinds of nitride semiconductor films that have different composition each other, so formed device has the characteristics similar to that of the single-layered layer.

And where the p-type low-doped layer 9 is formed of a multi-film layer, preferably either ones of the nitride semiconductor films are made of $Al_sGa_{1-s}N$ ($0 < s < 0.5$) and the average Al composition ratio of the p-type low-doped layer 9 is less than that of the p-cladding layer 8.

Also where the p-type low-doped layer 9 is formed of a multi-film layer, more preferably, either ones of the nitride semiconductor films are made of $Al_sGa_{1-s}N$ ($0 < s < 0.5$) while the other films are made of GaN, and the average Al composition ratio of the p-type low-doped layer 9 is less than that of the p-cladding layer 8.

As described above, the p-type low-doped layer 9 is formed of a multi-film layer having the nitride semiconductor film made of $Al_sGa_{1-s}N$ ($0 < s < 0.5$), or a multi-film layer having the nitride semiconductor film made of $Al_sGa_{1-s}N$ ($0 < s < 0.5$) and the nitride semiconductor film made of GaN, so that the films containing Al have the crystallinity improved and the electrostatic withstanding voltage increased.

Further, where the p-type low-doped layer 9 is formed of a multi-film layer, each of the film thickness is adjusted to be less than 100 angstroms and more than several angstroms.

It is noted that, in the practice of the invention, the p-type impurity can be added while the p-type low-doped layer 9 is grown.

In case where the p-type impurity can be added while the p-type low-doped layer 9 is grown, the impurity concentration of the p-type low-doped layer 9 has the distribution curve of the p-type impurity similar to that as shown in FIG. 2, and also has the minimal point adjusted to be a relative low value, for example, less than $1 \times 10^{19}/cm^3$, so that a similar effect to the present embodiment can be achieved.

In Embodiment 2 as described above, the preferable structure for the nitride semiconductor layers (the multi-film layer or single layered layer, composition and impurity concentration, or the like) rather than the p-type low-doped layer 9 as mentioned above, is similar to that of Embodiment 1, the effect cased by the structure is also similar to that of Embodiment 1.

According to the present embodiment, the active layer 7 may be formed of the multiple quantum well structure or the single quantum well structure.

According to Embodiment 2, the device with the active layer 7 formed of the single quantum well structure has a luminous intensity lower than that with the active layer 7 formed of the multiple quantum well structure. Both of devices have the electrostatic withstanding voltage, which are similarly and substantially improved.

As described above, in the nitride semiconductor device of Embodiment 2, the distribution of the p-type impurity concentration among three layers of the p-cladding layer 8, the p-type low-doped layer 9, and the p-contact layer 10 is adjusted to those of a medium doped layer, a low-doped layer, and a high doped layer. If the p-type impurity concentration of the p-type low-doped layer 9 is adjusted to be less than those of the p-cladding layer 8 and the p-contact layer 10, and the minimal point thereof is less than $1 \times 10^{19}/cm^3$, the p-type impurity concentration of the p-type low-doped layer 9 is not limited thereto. In other words, according to the present invention, the p-type impurity concentration of the p-cladding layer 8 may be the same as or greater than that of the p-contact layer 10 under the above-mentioned condition.

So formed device with the active layer of the single quantum well structure has the electrostatic withstanding voltage increased, and so formed device with the active layer of the multiple quantum well structure has both of the luminous intensity and electrostatic withstanding voltage increased.

Also, in order to make the p-region layers have the p-type characteristics and the resistivity lowered, an annealing step is conducted for the resultant nitride semiconductor device according to the present invention. As the annealing step is described in the Japanese Patent JP-2540791, which is incorporated herein as a reference, after growing the a nitride based compound semiconductor doped with p-type impurity by a vapor phase epitaxy, the nitride based compound semiconductor doped with p-type impurity is thermally exposed in the atmosphere at the temperature of 400° C., so that a hydrogen is forced to come out of the nitride gallium based compound semiconductor thereby having the semiconductor to have the p-type characteristics.

Although several examples are disclosed hereinafter, the present invention is not particularly limited thereto.

EXAMPLE 1

Referring to FIG. 1, Example 1 is explained hereinafter.

A substrate 1 of sapphire (C-face) is set within a MOCVD reactor flown with $H_2$, and the temperature of the substrate is set to 1050° C., the substrate 1 is cleaned.

(Buffer Layer 2)

Subsequently, the growth temperature is decreased to 510° C. and a buffer layer 2 made of GaN which has a thickness of about 100 angstroms is grown on the substrate 1 flown with $H_2$ as a carrier gas, and $NH_3$ and TMG (trimethylgallium) as material gases into the reactor.

(Undoped GaN Layer 3)

After growing the buffer layer 2, only TMG is held, and the substrate temperature is increased to 1050° C. After the temperature is stable, again the material gas of TMG and $NH_3$ and the carrier gas of $H_2$ are flown into the reactor to grow the undoped GaN layer 3 having a thickness of 1.5 μm on the buffer layer 2.

(N-contact Layer 4)

While the growth temperature is kept to 1050° C., the material gas of TMG and $NH_3$, and an impurity gas of $SiH_4$ are flown into the reactor to grow the n-contact layer 4 of GaN doped with Si having the Si impurity concentration of $5 \times 10^{18}/cm^3$ and thickness of 2.265 μm on the undoped GaN layer 3.

(First N-region Multi-film Layer 5)

Only $SiH_4$ gas is held and the substrate temperature is maintained at 1050° C., the first multi-film layer 5 is grown, which comprises three films, that is, a lower-film 5a, a middle-film 5b, and a upper-film 5c. The material gas of TMG and $NH_3$ is flown into the reactor to grow the lower-film 5a of GaN undoped with the thickness of 2000 angstroms. Next, the impurity gas of $SiH_4$ is, in addition, flown into the reactor to grow the middle-film 5b of GaN doped with Si having the impurity concentration of $4.5 \times 10^{18}/cm^3$ and the thickness of 300 angstroms. And finally, the impurity gas is held, maintaining the growth temperature, to grow the upper-film 5c of GaN undoped with the thickness of 50 angstroms.

(Second N-region Multi-film Layer 6)

Next, at the same growth temperature, the fourth nitride semiconductor film of undoped GaN is grown with the thickness of 40 angstroms. And after the growth temperature is set to 800° C., the material gases of TMG, TMI, and $NH_3$ are flown into the reactor to grow the third nitride semiconductor film of undoped $In_{0.13}Ga_{0.87}N$ with the thickness of 20 angstroms. By repeating the steps, the fourth and third nitride semiconductor films are laminated alternately and ten times and the fourth nitride semiconductor film is finally laminated with the thickness of 40 angstroms to complete the second n-region multi-film layer 6 of the superlattice structure with the thickness of 640 angstroms.

(Active Layer 7)

In order to grow the active layer 7, the barrier layer made of undoped GaN with a thickness of 200 angstroms is laminated, the growth temperature is set to 800° C., and then the well layer made of $In_{0.4}Ga_{0.6}N$ with a thickness of 30 angstroms is deposited thereon using TMG, TMI, and $NH_3$. These steps are repeated four times. And another barrier layer made of undoped GaN with a thickness of 200 angstroms is laminated thereon. The active layer 7 has a multiple quantum well structure with a thickness of 1120 angstroms in total.

(Medium-doped Multi-film P-cladding Layer 8)

After the growth temperature is set to 1050° C., the material gas of TMG, TMA (trimethylaluminum) and $NH_3$, the impurity gas of $Cp_2Mg$ (cyclopentadienyl magnesium), the carrier gas of $H_2$, are flown into the reactor to laminate a first nitride semiconductor film made of p-type $Al_{0.2}Ga_{0.8}N$ doped with Mg in the concentration of $5 \times 10^{19}/cm^3$ with a thickness of 40 angstroms. Then the growth temperature is set to 800° C., the material gas of TMG, TMA and $NH_3$, the impurity gas of $Cp_2Mg$, the carrier gas of $H_2$, are flown into the reactor to laminate a second nitride semiconductor film made of p-type $In_{0.03}Ga_{0.97}N$ doped with Mg in the concentration of $5\times10^{19}/cm^3$ with a thickness of 25 angstroms. These steps are repeated five times in the order of the first and second nitride semiconductor film. And finally, another first nitride semiconductor film with a thickness of 40 angstroms is laminated thereon to complete the multi-film p-cladding layer 8 with a thickness of 365 angstroms, which has a super-lattice structure.

(P-type Low-doped Layer 9)

The growth temperature is set to 1050° C., the material gas of TMG and $NH_3$, the carrier gas of $H_2$, are flown into the reactor to laminate a p-type low-doped layer 9 made of undoped GaN with a thickness of 2000 angstroms. Although the p-type low-doped layer 9 is laminated with the material of undoped GaN, the impurity Mg doped within the multi-film p-cladding layer 8 is diffused into the p-type low-doped layer 9 while the p-type low-doped layer 9 is laminated on the multi-film p-cladding layer 8. Furthermore, as described below, the impurity Mg doped in the high-doped p-type contact layer 10 is also diffused into the p-type low-doped layer 9 while the high-doped p-type contact layer 10 is laminated on the p-type low-doped layer 9. Therefore, the low-doped layer 9 shows a p-type characteristics.

As shown in FIG. 2, the distribution of the Mg impurity concentration of the low-doped layer 9 has the minimal value $2\times10^{18}/cm^3$, and a value similar to that of the p-cladding layer 8 adjacent to the composition face between the p-cladding layer 8 and the low-doped layer 9. The distribution of the Mg impurity concentration of the low-doped layer 9 is reduced gradually as being apart from the p-cladding layer 8 to the minimal value adjacent to the composition face (just before the formation of the p-contact layer 10) between the low-doped layer 9 and the p-contact layer 10.

(High-doped P-contact Layer 10)

The growth temperature is set to 1050° C., the material gas of TMG, and $NH_3$, the impurity gas of $Cp_2Mg$, the carrier gas of $H_2$, are flown into the reactor to laminate a p-contact layer made of p-type GaN doped with Mg in the concentration of $1\times10^{20}/cm^3$ with a thickness of 1200 angstroms. After growing the p-contact layer 10 and the temperature is cooled down to the room temperature, then the wafer is annealed at 700° C. within the $N_2$ atmosphere to make the p-type layers have less resistivity.

After annealing, the resultant wafer is taken out of the reactor, a desired mask is formed on the top surface of the p-contact layer 10, and the wafer is etched from a side of the p-contact layer 10 to expose surfaces of the n-type contact layer 4 as shown in FIG. 1.

After being etched, a transparent p-electrode 11 containing Ni and Au with a thickness of 200 angstroms and a p-electrode pad 12 made of Au with a thickness of 0.5 μm for wire-bonding are successively formed on the substantially overall surface of the p-contact layer 10. Meanwhile, an n-electrode 12 containing W and Al is formed on the exposed surface by the etching step. Thus, the LED device is completed.

This LED device has optical and electrical characteristics emitting light with a peak wavelength of 520 nm at the forward current of 20 mA and the forward voltage of 3.5V. The forward voltage is less by approximately 1.0V and the luminous intensity is improved to double in comparison with those of the conventional LED device of the multiple quantum well structure. Advantageously, the resultant LED device has a reverse electrostatic withstanding voltage that is more than that by 1.5 times and a forward electrostatic withstanding voltage that is more by 2 times than those of the conventional LED device.

The conventional LED device is comprised by successively depositing a first buffer layer made of GaN, a second buffer layer made of undoped GaN, an n-contact layer made of GaN doped with Si, an active layer of the multiple quantum well structure similar to Example 1, a single-layered layer made of $Al_{0.1}Ga_{0.9}N$ doped with Mg, and a p-contact layer made of GaN doped with Mg.

EXAMPLE 2

Another LED device is manufactured, which is similar to that of Example 1 except that the active layer 7 is formed as described below. Therefore, no further explanation will be made thereto.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.3}Ga_{0.7}N$ with a thickness of 30 angstroms. These steps are repeated 6 times, and lastly, another barrier layer is laminated, so that each of the well layers is sandwiched by the barrier layers on both surfaces. Thus, the active layer 7 of Example 2 is grown of the multiple quantum well structure with a thickness of 1930 angstroms.

The resultant LED device emits pure blue light with a peak wavelength of 470 nm at the forward current of 20 mA and has favorable optical and electrical characteristics similar to that of Example 1.

EXAMPLE 3

Again, another LED device is manufactured, which is similar to that of Example 1 except that the active layer is formed as described below. Therefore, no further explanation will be made thereto.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.3}Ga_{0.07}N$ with a thickness of 30 angstroms. These steps are repeated 5 times, and lastly, another barrier layer is laminated, so that each of the well layers is sandwiched by the barrier layers on both surfaces. Thus, the active layer 7 of Example 3 is grown of the multiple quantum well structure with a thickness of 1650 angstroms.

The resultant LED device emits pure blue light with a peak wavelength of 470 nm at the forward current of 20 mA and has favorable optical and electrical characteristics similar to that of Example 1.

EXAMPLE 4

Another LED device is manufactured, which is similar to that of Example 1 except that the active layer is formed as described below. Therefore, no further explanation will be made thereto.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.35}Ga_{0.65}N$ with a thickness of 30 angstroms. These steps are repeated 6 times, and lastly, another barrier layer is laminated, so that each of the well layers is sandwiched by the barrier layers on both surfaces. Thus, the active layer 7 of Example 4 is grown of the multiple quantum well structure with a thickness of 1930 angstroms.

The resultant LED device emits bluish green light with a peak wavelength of 500 nm at the forward current of 20 mA and has favorable optical and electrical characteristics similar to that of Example 1.

EXAMPLE 5

Another LED device is manufactured, which is similar to that of Example 1 except that the active layer is formed as described below. Therefore, no further explanation will be made thereto.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.35}Ga_{0.65}N$ with a thickness of 30 angstroms. These steps are repeated 3 times, and lastly, another barrier layer is laminated, so that each of the well layers is sandwiched by the barrier layers on both surfaces. Thus, the active layer 7 of Example 5 is grown of the multiple quantum well structure with a thickness of 1090 angstroms.

The resultant LED device emits bluish green light with a peak wavelength of 500 nm at the forward current of 20 mA and has favorable optical and electrical characteristics similar to that of Example 1.

EXAMPLE 6

Another LED device is manufactured, which is similar to that of Example 1 except that the second n-region multi-film layer 6 is not grown. Therefore, no further explanation will be made thereto.

The resultant LED device has the device characteristics including the luminous intensity which are less desirable than that of Example 1, but has the electrostatic withstanding voltage similar to that of Example 1.

EXAMPLE 7

Another LED device is manufactured, which is similar to that of Example 1 except that the multi-film layer 8 is modified as described below. Therefore, no further explanation will be made thereto.

(Single-Layered p-Cladding Layer 8)

The growth temperature is set to 1050° C., the material gas of TMG, TMA, and $NH_3$, and the carrier gas of $H_2$, are flown into the reactor to grow a single-layered p-cladding layer 8 made of $Al_{0.16}Ga_{0.84}N$ in the Mg impurity concentration of $5\times10^{19}/cm^3$ with a thickness of 300 angstroms.

The p-cladding layer 8 is formed of the single-layered structure rather than the multi-film layer structure, so that the device characteristics such as the luminous intensity is less desirable but the electrostatic withstanding voltage is similar to that of Example 1. In case where the p-cladding layer 8 is formed of the single-layered structure, the LED devices can be manufactured more easily than the case where it is formed of the multi-film layer structure.

EXAMPLE 8

Another LED device is manufactured, which is similar to that of Example 1 except that the thickness of the n-contact layer 4 and the first n-region multi-film layer 5 are modified as described below. Therefore, no further explanation will be made thereto.

(N-contact Layer 4)

The n-contact layer 4 is modified to have the thickness of 2.165 μm.

(First N-region Multi-film Layer 5)

Only $SiH_4$ gas is held and the substrate temperature is maintained at 1050° C., the first multi-film layer 5 is grown, which comprises three films, that is, a lower-film 5a, a middle-film 5b, and a upper-film 5c. The material gas of TMG and $NH_3$ is flown into the reactor to grow the lower-film 5a of undoped GaN with the thickness of 3000 angstroms. Next, the impurity gas of $SiH_4$ is, in addition, flown into the reactor to grow the middle-film 5b with the thickness of 300 angstroms made of GaN doped with Si in the impurity concentration of $4.5\times10^{18}/cm^3$. And the impurity gas is again held, maintaining the growth temperature, to grow the upper-film 5c of GaN undoped with the thickness of 50 angstroms. Thus the first n-region multi-film layer 5 is obtained with the thickness of 3350 angstroms in total.

The resultant LED device has favorable optical and electrical characteristics similar to those of Example 1.

EXAMPLE 9

Another LED device is manufactured, which is similar to that of Example 8 except that the thickness of the n-contact layer 4 is 4.165 μm and the total thickness of the undoped GaN layer 3, the n-contact layer 4, and the first n-region multi-film layer 5 is 6.0 μm. Therefore, no further explanation will be made thereto.

The resultant LED device has the electrostatic withstanding voltage more favorable than that of Example 8, and has the other optical and electrical characteristics similar to those of Example 8.

EXAMPLE 10

Another LED device is manufactured, which is similar to that of Example 8 except that the p-type low-doped layer has the thickness of 3000 angstroms and minimal value of the Mg impurity concentration of $1\times10^{18}/cm^3$.

The resultant LED device has the optical and electrical characteristics similar to those of Example 8.

EXAMPLE 11

Another LED device is manufactured, which is similar to that of Example 8 except that the Mg impurity concentration of the medium-doped multi-film layer 8 including the first and second nitride semiconductor film, the high-doped p-contact layer 10, and the low-doped layer 9 is $1\times10^{19}/cm^3$, $5\times10^{19}/cm^3$, and $1\times10^{18}/cm^3$, respectively.

The resultant LED device has the optical and electrical characteristics similar to those of Example 8.

EXAMPLE 12

Another LED device is manufactured, which is similar to that of Example 8 except that the first nitride semiconductor film of the medium-doped multi-film p-cladding layer 8 is doped in the Mg impurity concentration of $5\times10^{19}/cm^3$ and the second nitride semiconductor film is undoped. Thus, the first nitride semiconductor film has the impurity concentration different from that of the second nitride semiconductor film. The average of the Mg impurity concentration of the medium-doped multi-film p-cladding layer 8 is $2\times10^{19}/cm^3$, and the minimum of the Mg impurity concentration of the low-doped layer 9 adjacent thereto is $3\times10^{18}/cm^3$. The Mg impurity concentration of the high-doped p-contact layer 10 is $1\times10^{20}/cm^3$.

The resultant LED device has the optical and electrical characteristics similar to those of Example 8.

EXAMPLE 13

Another LED device is manufactured, which is similar to that of Example 1 except that a p-type low-doped layer 9 made of $Al_{0.05}Ga_{0.95}N$ with a thickness of 1000 angstroms is grown with the material gas of TMG, TMA, and $NH_3$. The low-doped layer 9 is grown so that the low-doped layer 9 has also the minimum of the Mg concentration, which is lower than that of the p-cladding layer 8 and the p-contact layer 10.

The resultant LED device has the optical and electrical characteristics similar to those of Example 1.

EXAMPLE 14

Another LED device is manufactured, which is similar to that of Example 1 except that the flow rate of the impurity gas of $Cp_2Mg$ is controlled so that the p-type low-doped layer 9 made of undoped GaN with a thickness of 2000 angstroms is grown to have the minimum of the Mg impurity concentration of $8\times10^{18}/cm^3$.

The resultant LED device has the optical and electrical characteristics similar to those of Example 1.

EXAMPLE 15

Another LED device is manufactured, which is similar to that of Example 8 except that the p-type low-doped layer 9 with a thickness of 1000 angstroms is grown to have the minimum of the Mg impurity concentration of $6.4\times10^{18}/cm^3$.

The resultant LED device has the optical and electrical characteristics similar to those of Example 8.

EXAMPLE 16

Two kinds of another LED device are manufactured which are similar to that of Example 8 except that the n-contact layer 4 has the thickness of 5.165 μm and 7.165 μm, and the total thickness of the undoped GaN layer 3, the n-contact layer 4, and the first n-region multi-film layer 5 is 7.0 μm and 9.0 μm, respectively.

The resultant LED device has the electrostatic withstanding voltage slightly more favorable than that of Example 8, and has the other optical and electrical characteristics similar to those of Example 8.

EXAMPLE 17

Another LED device is manufactured, which is similar to that of Example 8 except that the medium-doped multi-film layer p-cladding layer 8 includes the first nitride semiconductor film made of undoped $Al_{0.2}Ga_{0.8}N$ and the second nitride semiconductor film made of $In_{0.03}Ga_{0.97}N$ doped with Mg in the concentration of $5\times10^{19}/cm^3$.

The resultant LED device has the optical and electrical characteristics substantially similar to those of Example 8.

EXAMPLE 18

Another LED device is manufactured, which is similar to that of Example 8 except that the first n-region multi-film layer 5 includes the lower-film 5a made of undoped GaN with a thickness of 3000 angstroms, the middle-film 5b made of $Al_{0.1}Ga_{0.9}N$ with a thickness of 300 angstroms, and the upper-film 5c with a thickness of 50 angstroms.

The resultant LED device has the optical and electrical characteristics substantially similar to those of Example 8 and favorable.

EXAMPLE 19

Another LED device is manufactured, which is similar to that of Example 8 except that the first n-region multi-film layer 5 includes the lower-film 5a made of undoped $Al_{0.1}Ga_{0.9}N$ with a thickness of 3000 angstroms, the middle-film 5b made of $Al_{0.1}Ga_{0.9}N$ doped in the concentration of $5\times10^{19}/cm^3$ with a thickness of 300 angstroms, and the upper-film 5c made of undoped $Al_{0.1}Ga_{0.9}N$ with a thickness of 50 angstroms.

The resultant LED device has the optical and electrical characteristics substantially similar to those of Example 8 and favorable.

EXAMPLE 20

Another LED device is manufactured, which is similar to that of Example 8 except that the first n-region multi-film layer 5 includes the lower-film 5a made of undoped $Al_{0.1}Ga_{0.9}N$ with a thickness of 3000 angstroms, the middle-film 5b made of GaN doped in the concentration of $4.5\times10^{18}/cm^3$ with a thickness of 300 angstroms, and the upper-film 5c made of undoped GaN with a thickness of 50 angstroms.

The resultant LED device has the optical and electrical characteristics substantially similar to those of Example 8 and favorable.

EXAMPLE 21

Another LED device is manufactured, which is similar to that of Example 8 except that the n-contact layer 4 is made of $Al_{0.05}Ga_{0.95}N$ doped with Si in the concentration of $4.5\times10^{18}/cm^3$ with a thickness of 4.165 μm.

The resultant LED device has the optical and electrical characteristics substantially similar to those of Example 8.

EXAMPLE 22

Another LED device is manufactured, which is similar to that of Example 1 except that an single-layered undoped GaN layer with a thickness of 1500 angstroms is grown substituting for the first n-region multi-film layer 5.

The resultant LED device has the optical and electrical characteristics substantially similar to those of Example 1, although the electrostatic withstanding voltage is slightly reduced.

EXAMPLE 23

Another LED device is manufactured, which is similar to that of Example 1 except that the second n-region multi-film layer 6 includes a fourth nitride semiconductor film and a third nitride semiconductor film made of $In_{0.13}Ga_{0.87}N$ doped with Si in the concentration of $5\times10^{18}/cm^3$.

The resultant LED device has the optical and electrical characteristics substantially similar to those of Example 1.

EXAMPLE 24

Another LED device is manufactured, which is similar to that of Example 1 except that the p-type low-doped layer 9 is grown by alternately laminating the undoped $Al_{0.05}Ga_{0.95}N$ layer with a thickness of 50 angstroms and the undoped GaN layer with a thickness of 50 angstroms, so that the total thickness of the p-type low-doped layer 9 is 2000 angstroms.

The resultant LED device has the optical and electrical characteristics substantially similar to those of Example 1.

EXAMPLE 25

Another LED device is manufactured, which is similar to that of Example 1 except that the p-cladding layer 8 and the p-contact layer 10 has the p-type impurity concentration of $1\times10^{20}/cm^3$ and $1\times10^{19}/cm^3$, and the p-type low-doped layer has the minimum of the impurity concentration which is less than $1\times10^{19}/cm^3$.

The resultant LED device has the optical and electrical characteristics substantially similar to those of Example 1.

EXAMPLE 26

Another LED device is manufactured, which is similar to that of Example 1 except that the p-cladding layer (a first p-type layer) 8 is made of GaN doped with Mg in the concentration of $5\times10^{19}/cm^3$ with a thickness of 300 angstroms, and the p-type low-doped layer 9 is made of undoped GaN layer with a thickness of 2000 angstroms.

The resultant LED device has the optical and electrical characteristics substantially similar to those of Example 1, although the luminous intensity is slightly less than that of Example 1.

EXAMPLE 27

Another LED device is manufactured, which is similar to that of Example 1 except that the p-cladding layer (a first p-type layer) 8 is made of GaN doped with Mg in the concentration of $5\times10^{19}/cm^3$ with a thickness of 300 angstroms, and the p-type low-doped layer 9 is made of undoped $Al_{0.05}Ga_{0.95}N$ layer with a thickness of 2000 angstroms.

The resultant LED device has the optical and electrical characteristics substantially similar to those of Example 1, although the luminous intensity is slightly less than that of Example 1.

EXAMPLE 28

Another LED device is manufactured, which is similar to that of Example 9 except that the active layer 7 and the p-type low-doped layer 9 are manufactured as described below.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.3}Ga_{0.7}N$ with a thickness of 30 angstroms. These steps are repeated 5 times, so that each of the well layers is sandwiched by the barrier layers on both surfaces. Thus, the active layer 7 of Example 2 is grown of the multiple quantum well structure with a thickness of 1650 angstroms.

(p-Type Low-Doped Layer 9)

The p-type low-doped layer 9 is formed of undoped $Al_{0.05}Ga_{0.95}N$ layer with a thickness of 2000 angstroms with use of TMG, TMA, and $NH_3$. And the Mg impurity within the adjacent layers is diffused into the p-type low-doped layer 9 so that the p-type low-doped layer 9 has the minimum of the Mg impurity concentration, which is less than $2\times10^{18}/cm^3$.

The resultant LED device has the optical and electrical characteristics substantially similar to those of Example 9 and favorable.

EXAMPLE 29

Another LED device is manufactured, which is similar to that of Example 28 except that the active layer 7 is manufactured as described below.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.35}Ga_{0.65}N$ with a thickness of 30 angstroms. These steps are repeated 6 times, so that each of the well layers is sandwiched by the barrier layers on both surfaces. Thus, the active layer 7 of Example 29 is grown of the multiple quantum well structure with a thickness of 1930 angstroms.

The resultant LED device has the optical and electrical characteristics substantially similar to those of Example 28 and favorable.

EXAMPLE 30

Another LED device is manufactured, which is similar to that of Example 28 except that the active layer 7 is manufactured as described below.

(Active Layer 7)

The barrier film made of undoped GaN with a thickness of 250 angstroms is laminated, and after the growth temperature is set to 800° C., the material gas of TMG, TMI, and $NH_3$, and the carrier gas of $H_2$, are flown into the reactor to laminate a well layer made of undoped $In_{0.4}Ga_{0.6}N$ with a thickness of 30 angstroms. These steps are repeated 4 times, so that each of the well layers is sandwiched by the barrier layers on both surfaces. Thus, the active layer 7 of Example 29 is grown of the multiple quantum well structure with a thickness of 1370 angstroms.

The resultant LED device has the optical and electrical characteristics substantially similar to those of Example 28 and favorable.

EFFECT OF THE PRESENT INVENTION

As clearly shown in the above description, according to the first nitride semiconductor device of the present invention, the nitride semiconductor device with the active layer of the multiple quantum well structure can be provided, in which the luminous intensity and the electrostatic withstanding voltage are improved allowing the expanded application to various products.

Also, according to the Second nitride semiconductor device of the present invention, the nitride semiconductor device can be provided, in which the electrostatic withstanding voltage is improved to make the nitride semiconductor device robust against the electrostatic withstanding voltage.

What is claimed is:

1. A nitride semiconductor device comprising:
an n-type first nitride semiconductor layer;
a p-type second nitride semiconductor layer including a p-type cladding layer, a p-type low-doped layer on said p-type cladding layer, the p-type low-doped layer having a concentration of p-type impurity which is lower than that of said p-type cladding layer, and a p-contact layer formed on said p-type low-doped layer, the p-contact layer having a concentration of p-type impurity which is higher than that of said p-type low-doped layer; and
an active layer located between said n-type first nitride semiconductor layer and said p-type second nitride semiconductor layer;
wherein said n-type first nitride semiconductor layer comprises an n-type contact layer, a first n-region multi-film layer located between said n-type contact layer and said active layer, and a second n-region multi-film layer located between said first n-region multi-film layer and said active layer,
wherein said first n-region multi-film layer comprises a lamination of an undoped lower layer, a middle layer doped with an n-type impurity and an undoped upper layer, and
wherein said second n-region multi-film layer comprises a lamination of at least three layers, said at least three layers including at least one third nitride semiconductor layer of a nitride semiconductor containing In, and said at least three layers further including at least one fourth nitride semiconductor layer of a composition which is different than that of said third nitride semiconductor layer, and wherein at least one of said third and fourth nitride semiconductor layers has a thickness of 100 Å or less.

2. A nitride semiconductor device comprising:
an n-type first nitride semiconductor layer;
a p-type second nitride semiconductor layer including a p-type cladding layer, a p-type low-doped layer on said p-type cladding layer, the p-type low-doped layer having a concentration of p-type impurity which is lower than that of said p-type cladding layer, and a p-contact layer formed on said p-type low-doped layer, the p-contact layer having a concentration of p-type impurity which is higher than that of said p-type low-doped layer; and
an active layer located between said n-type first nitride semiconductor layer and said p-type second nitride semiconductor layer;
wherein said n-type first nitride semiconductor layer comprises an n-type contact layer, an undoped single-film layer located between said n-type contact layer and said active layer, and an n-region multi-film layer located between said undoped single-film layer and said active layer,
wherein said n-region multi-film layer comprises a lamination of at least three layers, said at least three layers including at least one third nitride semiconductor layer of a nitride semiconductor containing In, and said at least three layers further including at least one fourth nitride semiconductor layer of a composition which is different than that of said third nitride semiconductor layer, and wherein at least one of said third and fourth nitride semiconductor layers has a thickness of 100 Å or less.

3. The nitride semiconductor device according to claim 2, wherein said undoped single-film layer has a thickness of 1000 Å to 3000 Å.

4. A nitride semiconductor device comprising:
an n-type first nitride semiconductor layer;
a p-type second nitride semiconductor layer; and
an active layer located between said n-type first nitride semiconductor layer and said p-type second nitride semiconductor layer;
wherein said n-type first nitride semiconductor layer comprises an n-type contact layer, a first n-region multi-film layer contacting said active layer and located between said n-type contact layer and said active layer, and a second n-region multi-film layer between said first n-region multi-film layer and said active layer,
wherein said first n-region multi-film layer comprises a lamination of at least four layers, said at least four layers including at least two third nitride semiconductor layers of undoped InGaN and at least two fourth nitride semiconductor of undoped GaN, and wherein at least one of said third and fourth nitride semiconductor layers has a thickness of 100 Å or less, and
wherein said second n-region multi-film layer comprises a lamination of an undoped lower layer, a middle layer doped with an n-type impurity and an undoped upper layer.

5. The nitride semiconductor device as claimed in claim 4 wherein said undoped lower layer, said middle layer and said undoped upper layer have a same composition.

6. The nitride semiconductor device as claimed in claim 5, wherein said undoped lower layer has a thickness of 500 Å to 8000 Å.

7. The nitride semiconductor device as claimed in any one of claims or 1, 2 or 4, wherein said third nitride semiconductor layer is comprised of $In_kGa_{1-k}N$ (0<k<1) and said fourth nitride semiconductor layer is comprised of $In_mGa_{1-m}N$ (0≦m<1, m<k).

8. The nitride semiconductor device as claimed in any one of claims 1 or 2, wherein said third and fourth nitride semiconductor layers are undoped.

9. The nitride semiconductor device as claimed in any one of claims 1 or 2, wherein said middle layer has a thickness of 150 Å to 400 Å, and said lower layer has a thickness of 500 Å to 8000 Å.

* * * * *